(12) United States Patent
Nagasaka et al.

(10) Patent No.: US 8,253,921 B2
(45) Date of Patent: Aug. 28, 2012

(54) EXPOSURE APPARATUS AND DEVICE FABRICATING METHOD

(75) Inventors: Hiroyuki Nagasaka, Kumagaya (JP); Soichi Owa, Kumagaya (JP)

(73) Assignee: Nikon Corporation, Tokyo (JP)

( * ) Notice: Subject to any disclaimer, the term of this patent is extended or adjusted under 35 U.S.C. 154(b) by 238 days.

(21) Appl. No.: 11/364,075

(22) Filed: Mar. 1, 2006

(65) Prior Publication Data

US 2006/0209279 A1 Sep. 21, 2006

Related U.S. Application Data

(63) Continuation of application No. PCT/JP2004/013190, filed on Sep. 3, 2004.

(30) Foreign Application Priority Data

Sep. 3, 2003 (JP) ................................. P2003-311923

(51) Int. Cl.
*G03B 27/52* (2006.01)
(52) U.S. Cl. ........................................... 355/30; 355/63
(58) Field of Classification Search .................... 355/53, 355/30
See application file for complete search history.

(56) References Cited

U.S. PATENT DOCUMENTS

| 4,346,164 | A |   | 8/1982  | Tabarelli et al. |        |
|-----------|---|---|---------|------------------|--------|
| 4,480,910 | A |   | 11/1984 | Takanashi et al. |        |
| 4,801,352 | A |   | 1/1989  | Piwczyk          |        |
| 5,442,183 | A | * | 8/1995  | Matsui et al. ............ | 250/441.11 |
| 5,610,683 | A |   | 3/1997  | Takahashi        |        |
| 5,715,039 | A |   | 2/1998  | Fukuda et al.    |        |
| 5,825,043 | A |   | 10/1998 | Suwa             |        |
| 6,555,834 | B1 |  | 4/2003  | Loopstra         |        |
| 6,940,582 | B1 | * | 9/2005 | Tanaka ............................ | 355/53 |
| 2002/0044260 | A1 | * | 4/2002 | Takahashi et al. .............. | 353/31 |
| 2002/0054280 | A1 |   | 5/2002 | Tokuda et al.   |        |
| 2003/0016342 | A1 | * | 1/2003 | Asami ............................. | 355/78 |
| 2003/0169407 | A1 | * | 9/2003 | Hasegawa et al. .............. | 355/30 |
| 2004/0031932 | A1 |   | 2/2004 | Vosters et al.   |        |
| 2004/0165159 | A1 |   | 8/2004 | Lof et al.       |        |
| 2005/0030498 | A1 |   | 2/2005 | Mulkens          |        |
| 2005/0068499 | A1 |   | 3/2005 | Dodoc et al.    |        |
| 2005/0117134 | A1 |   | 6/2005 | Nagasaka et al. |        |

FOREIGN PATENT DOCUMENTS

| DE | 221 563 A1  | 4/1985 |
| DE | 224 448 A1  | 7/1985 |
| EP | 1137054 A1  | 9/2001 |

(Continued)

OTHER PUBLICATIONS

Office Action issued in Japanese Patent Application No. 2005-513730; mailed Jan. 5, 2010; with English-language translation.

(Continued)

*Primary Examiner* — Edward J Glick
*Assistant Examiner* — Mesfin T Asfaw
(74) *Attorney, Agent, or Firm* — Oliff & Berridge, PLC

(57) ABSTRACT

An exposure apparatus including a projection optical system that projects an image of a mask onto a substrate held by a stage, and an atmosphere forming mechanism for forming a specific gas atmosphere between the projection optical system and the stage, wherein the atmosphere forming mechanism has a cushioning part that softens the force caused by the stage or the substrate making contact with the atmosphere forming mechanism, and that suppresses the transmission of that force to the projection optical system.

30 Claims, 15 Drawing Sheets

FOREIGN PATENT DOCUMENTS

| | | |
|---|---|---|
| EP | 1 207 425 A2 | 5/2002 |
| EP | 1 431 710 A2 | 6/2004 |
| EP | 1 477 856 A1 | 11/2004 |
| EP | 1 489 462 A2 | 12/2004 |
| EP | 1 494 267 A1 | 1/2005 |
| EP | 1 498 778 A1 | 1/2005 |
| EP | 1 571 697 A1 | 9/2005 |
| EP | 1 646 074 A1 | 4/2006 |
| JP | A-58-202448 | 11/1983 |
| JP | A 58-202448 | 11/1983 |
| JP | A 59-019912 | 2/1984 |
| JP | A-59-19912 | 2/1984 |
| JP | A 62-065326 | 3/1987 |
| JP | A-62-65326 | 3/1987 |
| JP | A 63-157419 | 6/1988 |
| JP | A-63-157419 | 6/1988 |
| JP | A 04-305915 | 10/1992 |
| JP | A-4-305915 | 10/1992 |
| JP | A-4-305917 | 10/1992 |
| JP | A 04-305917 | 10/1992 |
| JP | A 05-062877 | 3/1993 |
| JP | A-05-062877 | 3/1993 |
| JP | A 06-124873 | 5/1994 |
| JP | A-07-220990 | 8/1995 |
| JP | A 07-220990 | 8/1995 |
| JP | A-08-316125 | 11/1996 |
| JP | A 08-316125 | 11/1996 |
| JP | A 10-303114 | 11/1998 |
| JP | A-10-303114 | 11/1998 |
| JP | A-10-340846 | 12/1998 |
| JP | A 10-340846 | 12/1998 |
| JP | A 11-135400 | 5/1999 |
| JP | A-11-176727 | 7/1999 |
| JP | A 11-176727 | 7/1999 |
| JP | A-2000-058436 | 2/2000 |
| JP | A 2000-058436 | 2/2000 |
| JP | A 2001-210587 | 8/2001 |
| JP | A 2002-373849 | 12/2002 |
| JP | A-2003-234281 | 8/2003 |
| JP | A 2004-228497 | 8/2004 |
| JP | A 2004-303808 | 10/2004 |
| JP | A 2004-343120 | 12/2004 |
| WO | WO 99/49504 | 9/1999 |
| WO | WO 01/22480 A1 | 3/2001 |
| WO | WO 03/085708 A1 | 10/2003 |
| WO | WO 2004/019128 A2 | 3/2004 |

OTHER PUBLICATIONS

Notice of Allowance issued in Japanese Patent Application No. 2005-513730; mailed Apr. 23, 2010; with English-language translation.

International Search Report issued in International Patent Application No. PCT/JP2004/013190; mailed Dec. 21, 2004.

Written Opinion issued in International Patent Application No. PCT/JP2004/013190; mailed Dec. 21, 2004.

Search Report issued in European Patent Application No. 04772929.8; mailed Oct. 8, 2008.

Office Action issued in Singapore Patent Application No. 200602389-9; mailed May 9, 2008.

Office Action issued in Singapore Patent Application No. 200602389-9; mailed Apr. 21, 2009.

Office Action issued in Chinese Patent Application No. 200480025055.2; mailed Jan. 18, 2008; with English-language translation.

Notice of Allowance issued in Chinese Patent Application No. 2004800250552; mailed Nov. 21, 2008; with English-language translation.

Office Action issued in corresponding Chinese Application No. 200910005724.4 on May 4, 2010. (with English language translation).

Office Action issued in corresponding Korean Application No. 10-2006-7003372 on Mar. 28, 2011. (with English language translation).

Office Action issued in corresponding China Application No. 200910005724.4 on Aug. 8, 2011. (with English language Translation).

Office Action issued in China's Patent Application No. 200910005724.4 on Nov. 24, 2011. (with English language translation).

Sep. 22, 2011 Office Action in Taiwanese Patent Application No. 093126659 (with English translation).

* cited by examiner

EXPOSURE APPARATUS AND DEVICE FABRICATING METHOD

CROSS-REFERENCE TO RELATED APPLICATION

This is a Continuation Application of International Application No. PCT/JP2004/013190, filed Sep. 3, 2004, which claims priority to Japanese Patent Application No. 2003-311923 (filed Sep. 3, 2003). The contents of the aforementioned applications are incorporated herein by reference.

BACKGROUND OF THE INVENTION

1. Field of the Invention

The present invention relates to an exposure apparatus that is used when manufacturing an electronic device, such as a semiconductor device, a liquid crystal display device, an imaging device (CCD and the like), and a thin film magnetic head, and also relates to a device fabricating method.

2. Description of Related Art

When fabricating an electronic device, such as a semiconductor device and a liquid crystal display device, by a photolithographic process, a projection exposure apparatus is used that projects a pattern image of a mask or a reticle (hereinafter, generically referred to as a reticle), wherein a pattern is formed through a projection optical system onto every projection (shot) region on a substrate, which is coated with a photosensitive material (resist). The circuit of the electronic device is formed by transferring the circuit pattern onto the substrate to be exposed by exposing it with the abovementioned projection exposure apparatus and then performing postprocessing.

The level of integration of integrated circuits, i.e., the fineness of circuit patterns, has been increasing in recent years. Consequently, there is a trend towards shorter wavelengths in the illumination beam for exposure (exposure light) used in projection exposure apparatuses. Namely, short wavelength light sources, such as a KrF excimer laser (248 nm wavelength), are beginning to be used instead of the mercury lamp, which has been the mainstream light source until recently, and exposure apparatuses that use even shorter wavelength ArF excimer lasers (193 nm) are entering the final stages of commercialization. In addition, the development of an exposure apparatus that uses an $F_2$ laser (157 nm) is in progress with an aim toward achieving even higher levels of integration.

Beams that have a wavelength of less than approximately 190 nm belong to the vacuum ultraviolet region, and such beams do not transmit through air. This is because the energy of the beam is absorbed by substances (hereinafter, generically referred to as light absorbing substances), such as oxygen, water and carbon dioxide molecules contained in the air.

In an exposure apparatus that uses exposure light in the vacuum ultraviolet region, light absorbing substances must be reduced in, or eliminated from, the space along the optical path of the exposure light, so as to achieve a sufficient illumination intensity of the exposure light on the substrate to be exposed. Consequently, in an exposure apparatus, the space along the optical path is enclosed by a casing, and a transmissive gas that transmits the exposure light is supplied to the interior of that casing. In this case, if the total length of the optical path is, for example, 1000 mm, then the concentration of the light absorbing substances inside the space along the optical path is, for practical purposes, less than approximately 1 ppm.

Nevertheless, because of the frequent exchanging of the substrate, it is problematic to eliminate the light absorbing substances in the space along the optical path and in the space been the projection optical system and the substrate. For example, to enclose this space with the casing, a constitution is conceivable wherein a large sized casing is installed so that the mechanism for exchanging the substrate can also be enclosed. However, with this constitution, the larger the casing, the greater the quantity of gas that is consumed in supplying the interior of the casing, and the greater the cost burden becomes.

Consequently, with an exposure apparatus, technology to eliminate light absorbing substances from the space along the optical path is being considered, wherein an atmosphere forming mechanism that forms a local gas atmosphere is disposed between the projection optical system and the substrate. With this constitution, the atmosphere forming mechanism is disposed between the projection optical system and the substrate in a state wherein a clearance on the order of several millimeters is provided with respect to the substrate (refer to Japanese Laid-Open Publication No. 2001-210587).

In such an exposure apparatus, the stage, which is used for mounting the substrate, and the projection optical system are each supported by different support platforms. Active vibration eliminating for suppressing vibrations from the floor surface are provided to the support platform on the stage side and the support platform on the projection optical system side, respectively, and the spacing between the stage and the projection optical system is maintained in a prescribed state by the independent driving of these active vibration eliminating apparatuses. If some kind of trouble arises with the active vibration eliminating apparatuses and a movement occurs wherein the projection optical system and the stage mutually approach, then the possibility that a particularly serious problem will occur is small because the amount of that movement is sufficiently small compared with the spacing between the projection optical system and the substrate if the atmosphere forming mechanism is not disposed therebetween. However, if the atmosphere forming mechanism of the type discussed above is disposed between the substrate and the projection optical system, then the clearance between the substrate and the atmosphere forming mechanism unfortunately becomes smaller than the amount of movement discussed above. Furthermore, if some kind of trouble arises with the active vibration eliminating apparatuses, and the projection optical system and the stage mutually approach, then there is a possibility that the stage or the substrate will make contact with the atmosphere forming mechanism. If the stage or the substrate makes contact with the atmosphere forming mechanism in this manner, then the force due to this contact will be transmitted through the atmosphere forming mechanism to the projection optical system, which will adversely alter the imaging performance of the projection optical system.

SUMMARY OF THE INVENTION

A purpose of some aspects of the present invention is to prevent a change in the imaging performance of the projection optical system arising from the transmission of the force, which is caused by the stage or the substrate contacting the atmosphere forming mechanism, to the projection optical system.

A first aspect of the present invention adopts the constitution of an exposure apparatus, which has a projection optical system that projects an image of a mask onto a substrate held by a stage, including an atmosphere forming mechanism that forms a specific fluid atmosphere between the projection optical system and the stage or said substrate, wherein the atmosphere forming mechanism has a cushioning part that softens the force caused by contact with the stage or the substrate, and that suppresses the transmission of that force to the projection optical system.

The exposure apparatus of this embodiment, as described above, is manufactured by assembling various subsystems, including each of the constituent elements recited in the claims of the present application, so as to maintain prescribed mechanical, electrical, and optical accuracies. To ensure that these various accuracies are maintained, the following adjustments are performed before and after the assembly: an adjustment to achieve the optical accuracy for the various optical systems, an adjustment to achieve the mechanical accuracy for the various machine systems, and an adjustment to achieve the optical accuracy for the various electrical systems. The process of assembling the exposure apparatus from the various subsystems includes the mechanical connections, the wiring of the electronic circuits, the piping of the atmospheric pressure circuit, and the like, among the various subsystems. Of course, before the process of assembling the exposure apparatus from the various subsystems, there is the process of assembling each of the individual subsystems. After completing the assembly of the exposure apparatus from the various subsystems, an overall adjustment is performed to ensure the various accuracies of the exposure apparatus as a whole. Furthermore, it is preferable to manufacture the exposure apparatus in a clean room, wherein the temperature, the cleanliness level, and the like are controlled.

In this type of exposure apparatus according to the present invention, even if the atmosphere forming mechanism makes contact with the stage or the substrate, the transmission of the force arising from that contact to the projection optical system is suppressed by the cushioning part.

A second aspect of the present invention adopts the constitution wherein the cushioning part includes an expansion and contraction mechanism that, by expanding and contracting, brings into relative proximity the projection optical system side and the stage side of the atmosphere forming mechanism.

A third aspect of the present invention adopts the constitution of an exposure apparatus as recited in the second aspect, wherein the atmosphere forming mechanism includes an atmosphere forming part that forms the specific fluid atmosphere; and the cushioning part further includes a flexible material that connects the atmosphere forming part to a barrel that holds the projection optical system.

A fourth aspect of the present invention adopts the constitution of an exposure apparatus as recited in the second aspect, wherein the atmosphere forming mechanism includes an atmosphere forming part that forms the specific fluid atmosphere, and a support part that supports the atmosphere forming part to a support platform; and the support part also serves as the expansion and contraction mechanism.

A fifth aspect of the preset invention adopts the constitution of an exposure apparatus as recited in the fourth aspect, wherein the support part includes: a first support part, including one end part attached to the support platform; and a second support part, including: one end part that engages the other end part of the first support part; and an other end part attached to the atmosphere forming part; and when the atmosphere forming part makes contact with the stage or the substrate then the other end part of the first support part and one end part of the second support part disengage.

A sixth aspect of the present invention adopts the constitution of an exposure apparatus as recited in the fifth aspect, wherein the other end part of the first support part includes a first flange part, which is formed in a direction away from the projection optical system; the one end part of the second support part includes a second flange part formed toward the projection optical system; and the first support part and the second support part engage by the mounting of the second flange part to the first flange part.

A seventh aspect of the present invention adopts the constitution of an exposure apparatus as recited in the second aspect, wherein the atmosphere forming mechanism includes an atmosphere forming part that forms the specific fluid atmosphere; and one end part of the expansion and contraction mechanism is attached to the support platform, and the other end part of the expansion and contraction mechanism includes a cord shaped member attached to the atmosphere forming part.

An eighth aspect of the present invention adopts a constitution wherein the cushioning part includes a deformable part that, by deforming, brings into relative proximity the projection optical system side and the stage side of the atmosphere forming mechanism.

A ninth aspect of the present invention adopts a constitution wherein an elastically deformable member is used in the deformable part.

A tenth aspect of the present invention adopts a constitution wherein a plastically deformable member is used in the deformable part.

An eleventh aspect of the present invention adopts the constitution of an exposure apparatus as recited in the first aspect, wherein the atmosphere forming mechanism includes an atmosphere forming part that forms the specific fluid atmosphere; and the cushioning part is provided to one part of the atmosphere forming part.

A twelfth aspect of the present invention adopts the constitution of an exposure apparatus as recited in the eleventh aspect, wherein the atmosphere forming mechanism supports the atmosphere forming part through the cushioning part.

A thirteenth aspect of the present invention adopts the constitution of an exposure apparatus as recited in the eleventh aspect, wherein the cushioning part is provided to part of the atmosphere forming part on the stage or the substrate side.

A fourteenth aspect of the present invention adopts the constitution of an exposure apparatus as recited in the thirteenth aspect, wherein the cushioning part is made of a plastically deformable member or an elastically deformable member.

A fifteenth aspect of the invention adopts the constitution of an exposure apparatus as recited in the first aspect, wherein the atmosphere forming mechanism includes an atmosphere forming part that forms the specific fluid atmosphere; and the cushioning part forms at least part of the atmosphere forming part and includes a brittle material.

A sixth aspect of the present invention adopts a constitution wherein a clearance, which is at least the distance the atmosphere forming part moves when the stage or the substrate makes contact with the atmosphere forming mechanism, is provided between the atmosphere forming part and the projection optical system.

Next, a seventeenth aspect of the present invention adopts a constitution including a process that uses the exposure apparatus of the invention of the present patent application to transfer device pattern formed on the mask onto the substrate.

DETAILED DESCRIPTION OF THE INVENTION

The following explains one embodiment of the exposure apparatus and the device fabricating method according to the present invention, referencing the drawings. Furthermore, in the following embodiment, the present invention is applied to a step-and-scan system projection exposure apparatus that uses vacuum ultraviolet light as the exposure energy beam.

First Embodiment

Figure 1:
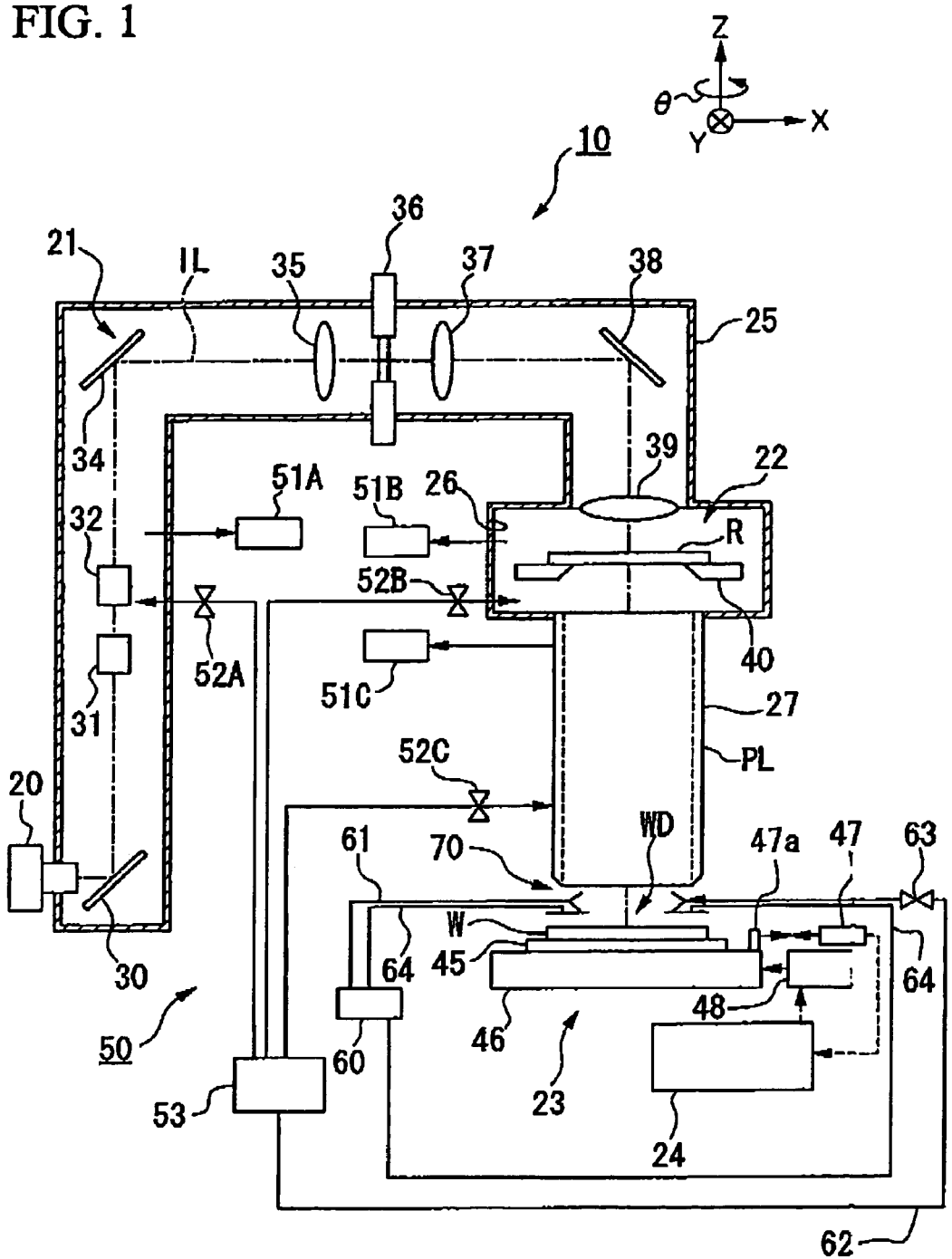
FIG. 1 shows a schematic constitution of an exposure apparatus to which the present invention is adopted.

FIG. 1 schematically shows the constitution of an exposure apparatus 10, wherein the present invention is applied. In this figure, the mechanism unit of the exposure apparatus 10 includes an illumination optical system 21, a reticle operation unit 22, a projection optical system PL, and a wafer operation unit 23. The illumination optical system 21, the reticle operation unit 22, and the projection optical system PL are housed inside an illumination system chamber 25, a reticle chamber 26, and a barrel 27, respectively, in a state isolated from the outside air (herein the gas inside an environmental control chamber, which is discussed later) with enhanced gastightness. In addition, the entirety of the exposure apparatus 10 is housed inside an environmental control chamber (not shown), wherein the internal air temperature is controlled so that it is maintained within a prescribed target range.

In this embodiment, an exposure light source 20 employs an $F_2$ laser light source that generates pulsed laser light with a 157 nm wavelength in the vacuum ultraviolet region. The exit end of the exposure light source 20 is attached to the lower part of the illumination system chamber 25. During exposure, exposure light IL (energy beam), which is emitted from the exposure light source 20 into the illumination system chamber 25, is reflected upward by a mirror 30, passes through an automatic tracking part (not shown) that aligns the optical axis that shifted due to vibrations and the like, and through a beam shaping optical system 31, which shapes the cross sectional shape, and controls the amount, of the light from the illumination system, and then enters a fly-eye lens (or rod lens) 32, which serves as an optical integrator (homogenizer). An aperture stop (not shown) is disposed at the exit surface of the fly-eye lens 32, and the exposure light IL that passes through the fly-eye lens 32 and the aperture stop is deflected by a mirror 34 in substantially the horizontal direction, passes through a relay lens 35, and reaches a field stop (reticle blind) 36.

The surface where the field stop 36 is disposed, is substantially conjugate optically with a pattern surface of a reticle R, and the field stop 36 includes a fixed blind, which defines the shape of a long, thin, rectangular illumination area at the pattern surface, and a movable blind, which confines the illumination area, in order to prevent the exposure of unnecessary portions at the start and end of scanning exposure. The exposure light IL that passes through the field stop 36 then passes trough a relay lens 37, a mirror 38, and a condenser lens system 39, which is fixed to a tip part of the illumination system chamber 25, and illuminates, with a uniform illumination intensity distribution, the rectangular (slit shaped) illumination area on the pattern surface of the reticle R. The illumination optical system 21 includes the exposure light source 20 through the condenser lens system 39, and the optical path of the exposure light IL inside the illumination optical system 21, i.e., the optical path from the exposure light source 20 through the condenser lens system 39, is sealed by the illumination system chamber 25.

The image of the pattern of the reticle R inside the illumination area is projected, based on the exposure light from the illumination optical system 21, through the projection optical system PL onto a wafer W (substrate), which is coated with a photosensitive material (photoresist), at a projection magnification β (βis, for example, ¼, ⅕, and the like) The wafer W is a disc shaped substrate, e.g., a semiconductor (silicon and the like), SOI (silicon-on-insulator), and the like.

The reticle R is held on a reticle stage 40 in the reticle operation unit 22. The reticle stage 40 micro drives the reticle R on a reticle base (not shown) in the Y direction synchronized to a wafer stage, which is discussed later. The position and rotational angle of the reticle stage 40 are measured by a laser interferometer (not shown) with high accuracy, and the reticle stage 40 is driven based on a control signal from a main control system 24, which includes a computer that performs supervisory control of this measurement value and the operation of the entire apparatus. The reticle stage 40 and a portion of the optical path of the exposure light IL (not shown), i.e., the optical path from the condenser lens system 39 through the projection optical system PL, are sealed by the reticle chamber 26.

The plurality of optical elements that constitute the projection optical system PL are housed inside the barrel 27, and the optical path, from the optical element on the reticle side of the projection optical system PL through the optical element on the wafer side, is sealed inside the barrel 27.

Here, if the exposure light IL is $F_2$ laser light, as in this embodiment, then the optical glass materials with satisfactory transmittance are limited to: fluorite ($CaF_2$ crystals): quartz glass doped fluorine, hydrogen and the like; magnesium fluoride ($MgF_2$); and the like. Therefore, the refractive optical system may be constituted using optical glass material that has a satisfactory transmittance. In addition, if it is difficult to obtain the desired imaging characteristics (chromatic aberration characteristics and the like) because the types of high transmittance optical materials are limited, then a catadioptric optical system, which combines dioptric elements and reflecting mirrors, may be adapted.

In the wafer operation unit 23, the wafer W is held at mounting surface on a wafer holder 45 by suction, and the wafer holder 45 is fixed onto a wafer stage 46. The wafer stage 46 continuously moves the wafer W on a wafer base plate, which is discussed later, in the Y direction synchronized to a reticle stage, which is discussed later, and moves the wafer W in steps in the X direction and the Y direction. In addition, the wafer stage 46 uses an auto focus system to align the surface of the wafer W with the image plane of the projection optical system PL, based on information related to the position of the surface of the wafer W (focus position) in the optical axis AX direction that was measured by an auto focus sensor (not shown). A laser interferometer 47 measures, with high accuracy, the position of the wafer stage 46 in the X direction and in the Y direction, the rotational angle about the X axis (amount of pitching), the rotational angle about the Y axis (amount of rolling), and the rotational angle about the Z axis (amount of yawing), and the stage drive system 48 drives the wafer stage 46 based on these measurement values and a control signal from the main control system 24. Furthermore, a reflecting mirror 47a, which is attached to the wafer stage 46 (wafer holder 45), reflects a laser beam (length measuring beam) from the laser interferometer 47, and a variety of constitutions are applicable, such as separate prism mirrors, an integrated L shaped mirror, or a constitution wherein a side surface of the wafer stage 46 (wafer holder 45) is processed into a mirror surface and used as a mirror. In addition, the wafer operation unit 23 includes the war holder 45, the wafer stage 46, the wafer base plate, and the like; furthermore, a wafer loader and the like (not shown), which serves as a conveyor system, is disposed to the side of the wafer operation unit 23

Figure 2:
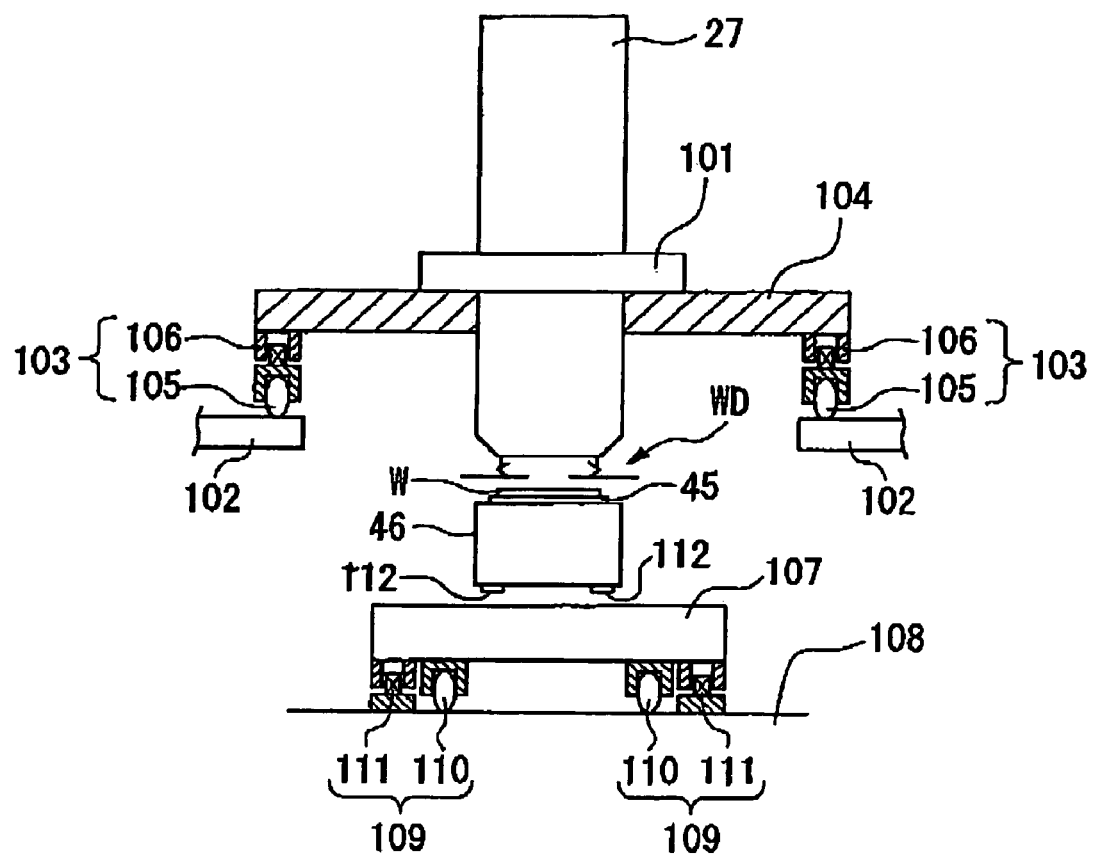
FIG. 2 is a schematic drawing for explaining a support structure of a projection optical system PL and a wafer stage in the exposure apparatus.

The support of the projection optical system PL and the wafer stage 46 will now be briefly explained, referencing the schematic drawing shown in FIG. 2. A flange part 101, which is integrated with the barrel 27, is provided at the outer circumference of this barrel 27 of the projection optical system PL. Furthermore, by inserting the barrel 27 into the barrel base plate 104 from above or from the side and engaging the flange part 101 thereto, the barrel 27 is supported by a barrel base plate 104 that is supported substantially horizontally by a first support platform 102 via active vibration eliminating apparatuses 103. Furthermore, the barrel plate 104 is a casting.

One of the active vibration eliminating apparatuses 103 is disposed in each corner part of the barrel base plate 104 (note that the active vibration eliminating apparatuses on the paper plane far side are not shown), and each includes an air mount 105, wherein the internal pressure is adjustable, and voice coil motors 106. The air mount 105 and the voice coil motor 106 are disposed in series on the first support platform 102.

In the exposure apparatus 10 according to this embodiment, these active vibration eliminating apparatuses 103 isolate, at the micro G level, the transmission of the vibrations, which are externally transmitted through the first support platform 102, to the projection optical system PL.

A wafer base plate 107 is provided and disposed below the wafer stage 46. This wafer base plate 107 is supported, substantially horizontally, via active vibration eliminating apparatuses 109 above a second support platform 108, which is formed separately from the abovementioned first support platform 102. An active vibration eliminating apparatus 109 is disposed at each corner of the wafer base plate 107 (furthermore, the active vibration eliminating apparatuses on the far side of the paper surface are not shown), and each includes an air mount 110 and a voice coil motor 111, which are disposed in parallel on the second support platform 108. Furthermore, a plurality of air bearings 112, which are non-contact bearings, are installed on the bottom surface of the wafer stage 46, and levitationally support the wafer stage 46 above the wafer base plate 107 with a clearance of, for example, approximately several microns. Furthermore, with the exposure apparatus 10 to the preset invention, the active vibration eliminating apparatuses 109 isolate, at the micro G level, the transmission of vibrations, which are externally transmitted though the second support platform 108, to the wafer stage 46.

Returning to FIG. 1, because the exposure light IL of this embodiment is ultraviolet light with a wavelength of 157 nm, the light absorbing substances with regard to exposure light IL include oxygen ($O_2$), water (water vapor: $H_2O$), carbon monoxide (CO), carbonated gas (carbon dioxide: $CO_2$), organic substances, halides, and the like. However, gases that transmit the exposure light IL (substances that absorb virtually no energy) include nitrogen gas ($N_2$), hydrogen ($H_2$), and the noble gases consisting of helium (He) neon (Ne), argon (Ar), krypton (Kr), xenon (Xe), and radon (Rn). Hereinafter, nitrogen gas and the noble gases will collectively be called "transmissive gases."

The exposure apparatus 10 of this embodiment includes a gas supply and exhaust system 50 that supplies and fills a transmissive gas, which has a low energy absorption with respect to the vacuum ultraviolet region beam, to the space along the optical path, i.e., to the interior of the illumination system chamber 25, the reticle chamber 26, and the barrel 27, and sets the pressure thereof on the same level as or higher than atmospheric pressure (e.g., higher than atmospheric pressure within a range of 0.001-10%). The gas supply and exhaust system 50 includes vacuum pumps 51A, 51B, 51C for exhaust, a gas cylinder 53 wherein the transmissive gas is stored, compressed or liquefied, in a high purity state, valves 52A, 52B, 52C that are controlled so that the open and close, and the like. Furthermore, the number and installation locations thereof are not limited to that shown in the drawing. The nitrogen gas acts as a light absorbing substance for light wherein the wavelength is less than approximately 150 nm, and helium gas can be used as the transmissive gas with wavelengths up to approximately 100 nm. In addition, because thermal conductivity of helium gas is approximately six times that of nitrogen gas, and the amount of fluctuation in the refractive index with respect to gas pressure changes is approximately ⅛ that of nitrogen gas, it is superior particularly for its high transmittance, the stability of the imaging characteristics of the optical system, and the cooling characteristics. Furthermore, because of the high cost of helium gas, if the wavelength of the exposure light IL is 150 nm or greater, as with $F_2$ laser light, then nitrogen gas may be used as the transmissive gas in order to reduce running cost.

In addition, an atmosphere forming mechanism forms a specific fluid atmosphere in the working distance portion WD, i.e., the space between the front portion (exit end) of the projection optical system PL and the wafer W. Furthermore, the explanation herein is made based on the abovementioned transmissive gas as the specific fluid. The atmosphere forming mechanism includes: an atmosphere forming part 70, which is disposed in the working distance portion WD; a gas supply piping 62, of which one end part is connected to the gas cylinder 53 of the fluid supply and exhaust system 50, and the other end part is connected to the atmosphere forming part 70; a valve 63, which is provided and disposed at a location along the gas supply piping 62; and a first exhaust piping 61 and a second exhaust piping 64, of which one end part is connected to a vacuum pump 60 for exhaust, and the other end part is connected to the atmosphere forming part 70. Furthermore, in this embodiment, the atmosphere forming part 70 is supported by the barrel 27, which supports the projection optical system PL, via support parts 71, which are discussed later. In addition, the barrel 27 in this embodiment functions as a support platform that supports the atmosphere forming part 70.

Figure 3:
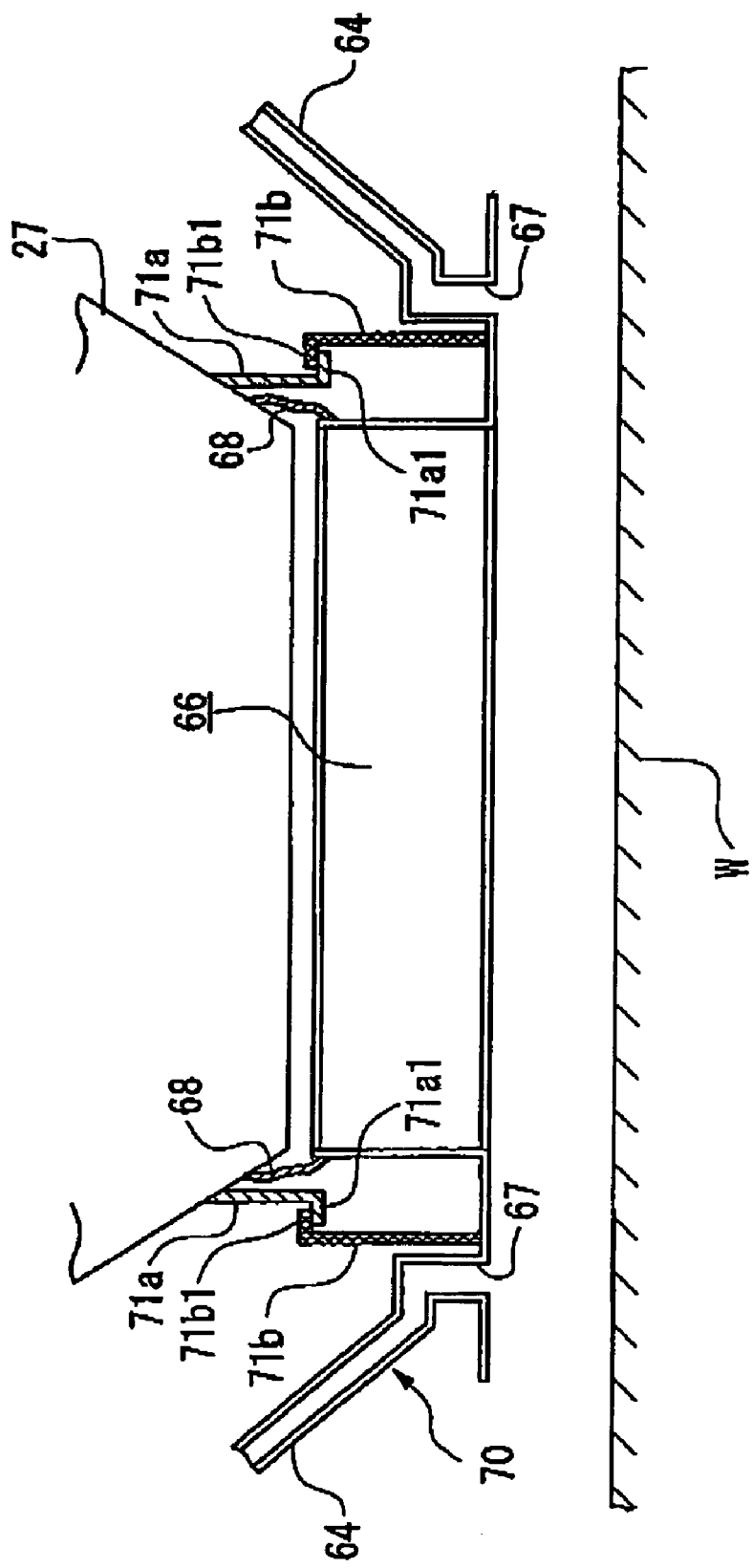
FIG. 3 shows an aspect wherein the vicinity of a working distance portion of the exposure apparatus, according to the first embodiment, is enlarged.
Figure 4:
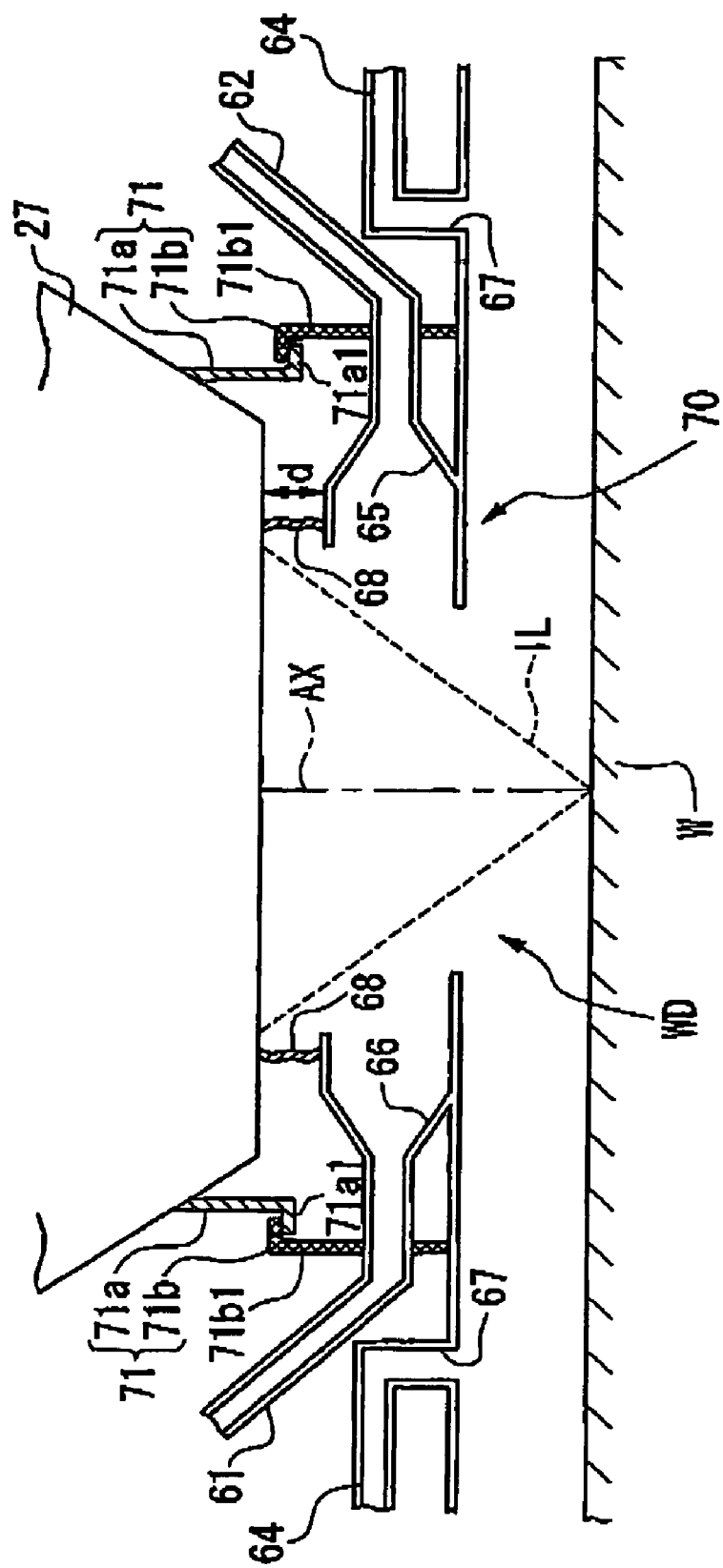
FIG. 4 shows an aspect wherein the vicinity of the working distance portion of the exposure apparatus, according to the first embodiment, is enlarged.
Figure 5:
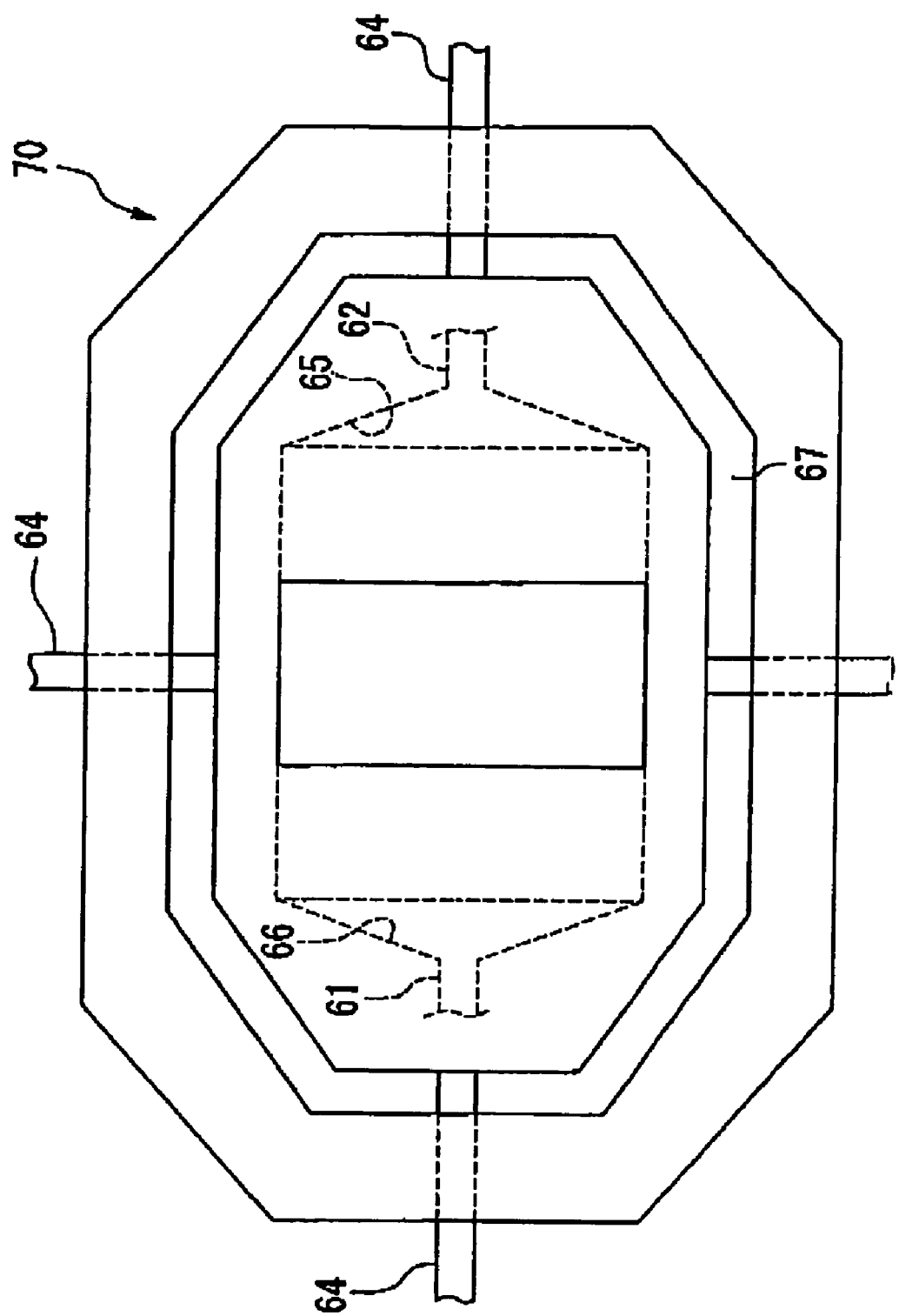
FIG. 5 shows an aspect wherein the vicinity of the working distance portion of the exposure apparatus, according to the first embodiment, is enlarged.

FIG. 3 to FIG. 5 show aspects wherein the vicinity of the working distance portion WD is enlarged. Furthermore, FIG. 3 shows an aspect of the vicinity of the working distance portion WD viewed in the X direction of FIG. 1, FIG. 4 shows an aspect of the vicinity of the working distance portion WD viewed from the Y direction, and FIG. 5 shows an aspect of the vicinity of the working distance portion WD viewed from above.

As shown in FIG. 3 to FIG. 5, the atmosphere forming part 70 is provided and disposed in the working distance portion WD so that it encloses the optical path of the exposure light IL. A gas supply port 65, to which the other end of the gas supply piping 62 is connected, and a first gas intake port 66, to which the other end of the first exhaust pipe 61 is connected, are provided to and disposed in this atmosphere forming part 70. The gas supply port 65 and the first gas intake port 66 each have open ends that are larger than the pipe diameter of the gas supply piping 62 and the first exhaust pipe 61, respectively, so as to make the flow of the gas in the working distance portion WD uniform, and are provided and disposed mutually opposed so that the optical axis AX of the projection optical system PL is interposed therebetween.

Furthermore, the atmosphere forming part 70 includes a second intake port 67, which is disposed surrounding the optical path of the exposure light IL and on the outer side of the gas supply port 65 and the first intake port 66, and to which the other end part of the second exhaust piping 64 is connected. Thus, by forming the second intake port 67 on the outer side of the gas supply port 65 and the first intake port 66 so that it surrounds the optical path of the exposure light IL, the transmissive gas, which flows out from between the wafer W and the atmosphere forming part 70, is sucked in without leaking outside of the working distance portion WD, and, furthermore, gas that attempts to newly infiltrate the interior of the working distance portion WD from outside it is sucked in by the second intake port 67 before it reaches the optical path of the exposure light IL. Consequently, the exposure apparatus 10 according to this embodiment can reliably make the optical path of the exposure light IL a transmissive gas atmosphere, and can also prevent the transmissive gas from leaking outside of the working distance portion WD.

A clearance "d" provided between the upper part of the atmosphere forming part 70 and the front portion of the projection optical system PL, and is at least the distance that the atmosphere forming part 70 moves when the wafer stage 46 (wafer holder 45), or the wafer W, makes contact with the atmosphere forming part 70, due to the independent driving of each of the active vibration eliminating apparatuses, which are discussed above. Furthermore, although the wafer stage 46 (wafer holder 45), or the wafer W, does not contact the atmosphere forming part 70 during normal operation of the exposure apparatus 10, they may make contact due to the independent driving of the active vibration eliminating apparatuses 103, 109, which are discussed above, when there is a problem, such as the introduction of large external vibrations to the exposure apparatus 10.

In the exposure apparatus 10 according to this embodiment, a film shaped member 68, which is for preventing the leakage of the transmissive gas from the clearance "d", is installed between the upper part of the atmosphere forming part 70 and the tip part of the barrel 27 so that it encloses the optical axis AX of the projection optical system PL. This film shaped member 68 is made of a flexible material that the transmissive gas does not permeate e.g., EVAL (tradename) and the like. Because the film shaped member 68 is flexible, it is possible to suppress the transmission of vibrations to the projection optical system PL through the atmosphere forming part 70. Furthermore, the film shaped member 68 constitutes one part of the cushioning mechanism according to the present invention.

The support parts 71 are for the purpose of enabling the atmosphere forming part 70 to be supported by the barrel 27, and a plurality of support parts 71 are disposed between the barrel 27 and the atmosphere forming part 70. Each of the support parts 71 includes a first support part 71*a*, one end of which is fixed to the barrel 27, and a second support part 71*b*, one end of which is fixed to the atmosphere forming part 70. A first flange part 71*a*1, which protrudes in a direction away from the projection optical system PL, is formed at the other end of the first support part 71*a*, and a second flange part 71*b*1, which protrudes toward the optical axis AX of the projection optical system PL and engages with the first flange part 71*a*1 from above, is formed at the other end of the second support part 71*b*. Furthermore, by mounting the second flange part 71*b*1; on the first flange part 71*a*1, the first flange part 71*a*1 and the second flange part 71*b*1 engage, and the atmosphere forming part 70 is thereby supported by the barrel 27. Furthermore, with the exposure apparatus 10 according to this embodiment, the support parts 71 serve the functions of some of the cushioning parts and the expansion and contraction mechanism according to the present invention. In this embodiment, the film shaped member 68 and the support parts 71, by their interaction, function as the cushioning parts of the present invention.

Figure 6:
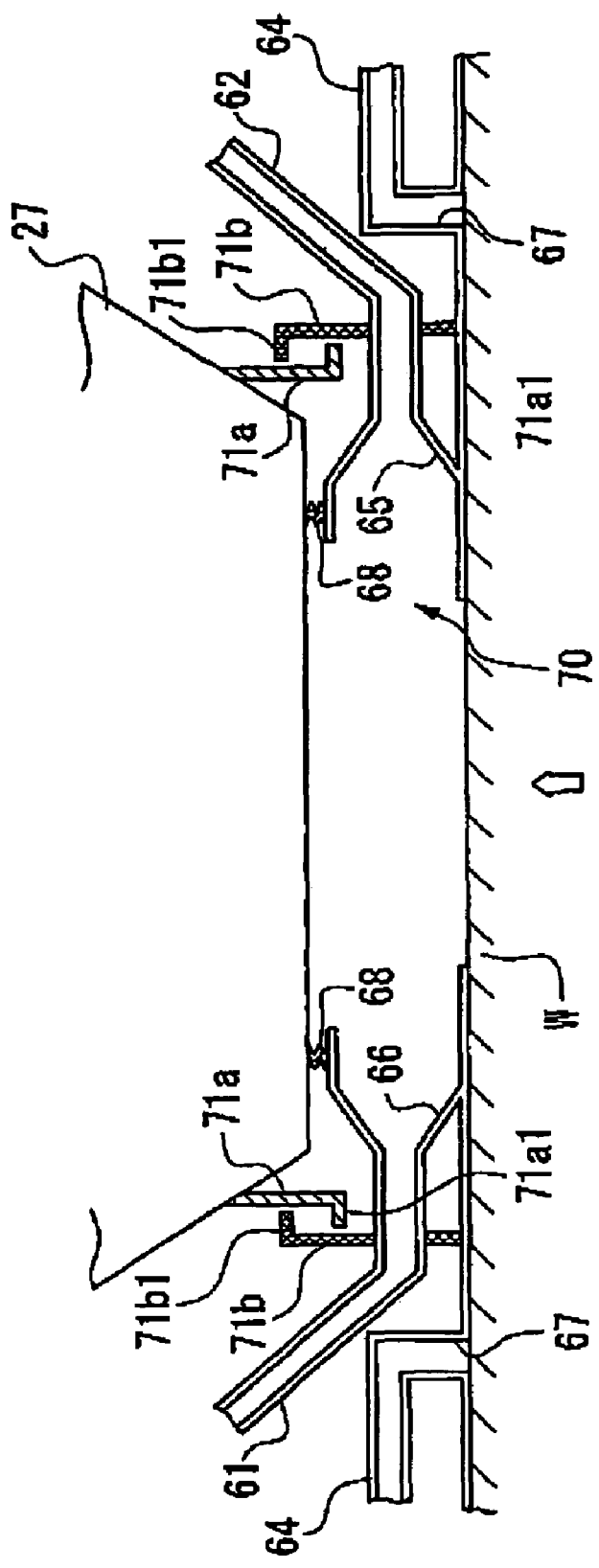
FIG. 6 shows an aspect of the exposure apparatus according to the first embodiment, wherein the wafer has contacted an atmosphere forming part.

Accordingly, as shown in FIG. 6, if the wafer stage 46 (wafer holder 45), or the wafer W, makes contact with the atmosphere forming part 70, and thereby moves it in the Z direction in FIG. 1, than the support parts 71 expand and contact in the Z direction by the disengagement of the first flange part 71*a*1 and the second flange part 71*b*1. Furthermore, a damper is disposed between the first flange part 71*a*1 and the second flange part 71*b*1, and this damper can expand and contract in the Z direction. With the exposure apparatus 10 according to this embodiment, the expansion and contraction of the support parts 71 and the film shaped member 68 cause the wafer stage 46 (wafer holder 45), or the wafer W (the stage side of the exposure apparatus according to the present invention), and the atmosphere forming part 70 (the projection optical system side according to the present invention) to approach relative to one another, thereby suppressing the transmission to the projection optical system PL of the force caused by the wafer stage 46 (wafer holder 45), or the wafer W, making contact with the atmosphere forming part 70. Consequently, in the exposure apparatus 10 according to this embodiment, the force caused by the wafer stage 46

(wafer holder 45), or the wafer W, making contact with the atmosphere forming part 70 is cushioned by the expansion and contraction of the support parts 71 and the film shaped member 68, and it is therefore possible to prevent changes in the imaging performance of the projection optical system PL. In addition, if the wafer stage 46 (wafer holder 45), or the wafer W, does contact the atmosphere forming part 70, as discussed above, then the weight of the atmosphere forming part 70 is added to the wafer stage 46, which does not get damaged because the weight of the atmosphere forming part 70 is not particularly great.

Furthermore, it is acceptable if one end of the first support part 71a is not fixed to the barrel 27, as discussed above, e.g., it may be fixed to the barrel base plate 104. In other words, the barrel base plate 104 functions as the support platform of the present invention.

In addition, the atmosphere forming part 70 is supported by a plurality of support parts 71 in the above embodiment, but the present invention is not limited thereto, e.g., the atmosphere forming part 70 may be supported by a unitary cylindrical support part that encloses the optical path of the exposure light IL.

With the exposure apparatus 10 according to this embodiment as described above, the pattern image of the reticle R is projected during normal operation onto each shot region on the wafer W through the optical path, wherein a transmissive gas atmosphere is maintained.

Second Embodiment

Figure 7:
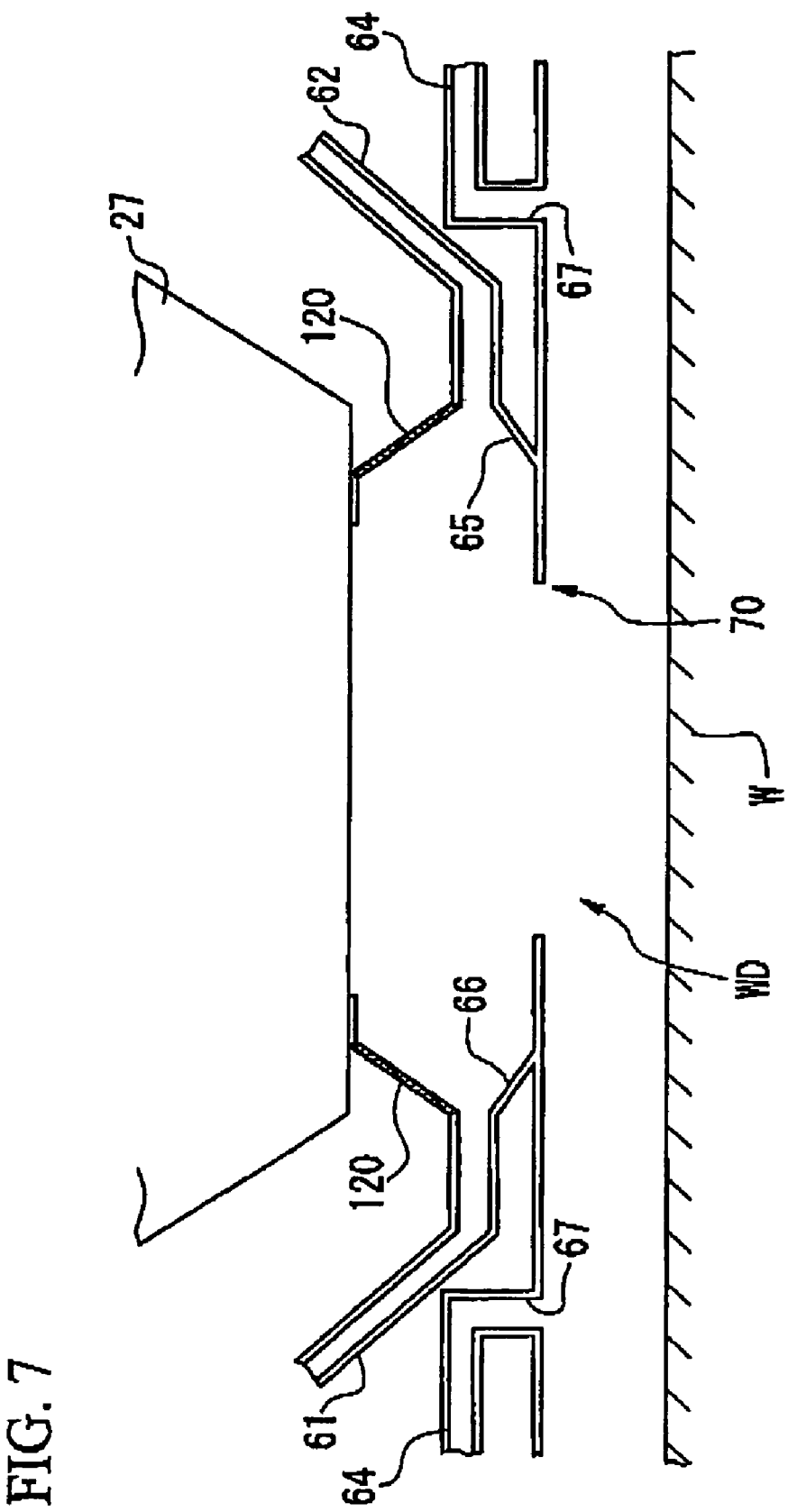
FIG. 7 shows an aspect wherein the vicinity of the working distance portion of the exposure apparatus, according to the second embodiment, is enlarged.
Figure 8:
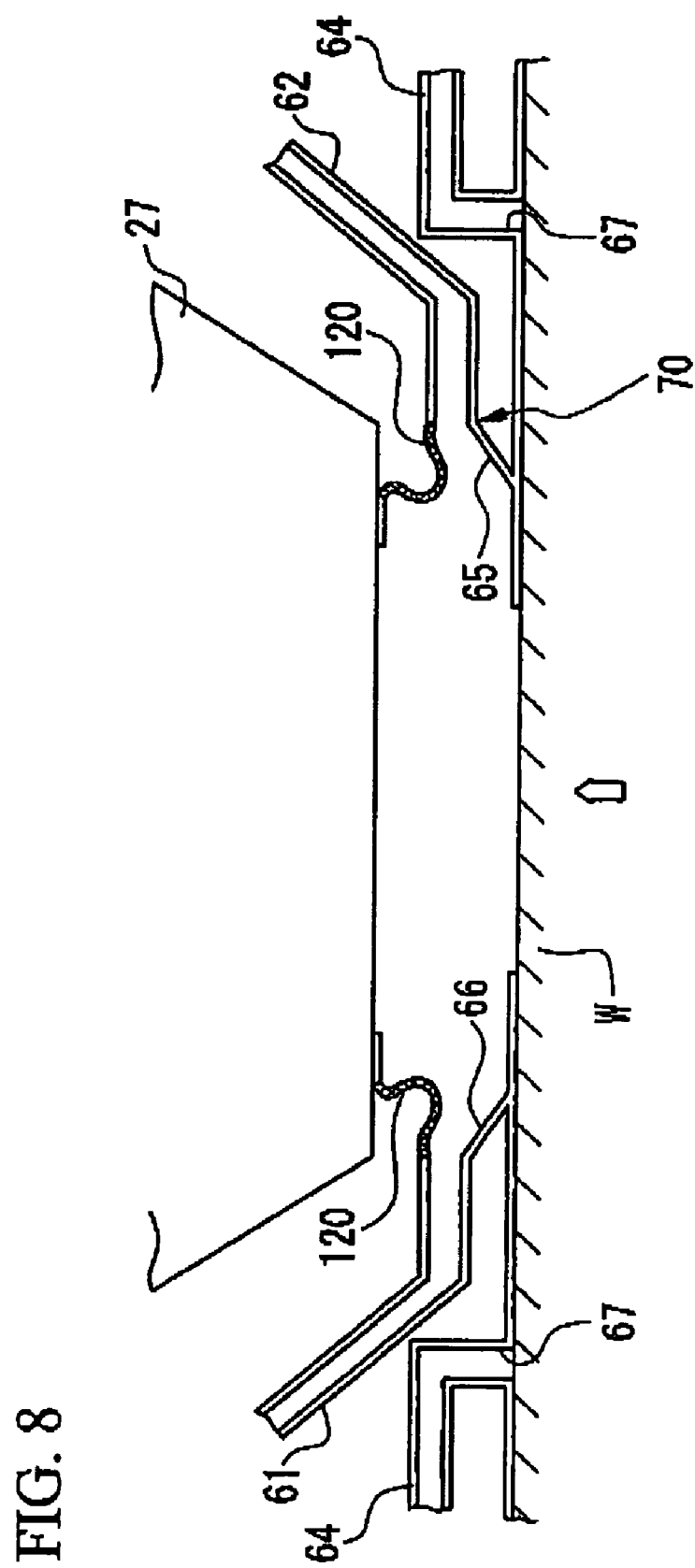
FIG. 8 shows an aspect of the exposure apparatus according to the second embodiment wherein the wafer has contacted the atmosphere forming part.

The following explains the second embodiment of the exposure apparatus according to the present invention, referencing FIG. 7 and FIG. 8. Furthermore, in the second embodiment, a mode is explained wherein a deformable part 120 is provided in part of the atmosphere forming part 70. In addition, elements in the second embodiment that have a function identical to that in the first embodiment are assigned the identical symbol, and the explanation thereof is omitted or simplified.

FIG. 7 shows an aspect of the vicinity of the working distance portion WD viewed from the X direction in FIG. 1, which was explained in the first embodiment. In FIG. 7, the deformable part 120 is made of an elastic body member (e.g., rubber, elastic plastic, and the like) that the transmissive gas does not permeate, and constitutes the upper part of the atmosphere forming part 70, i.e., at least part of the upper part of the gas supply port 65 and the upper part of the first intake port 66.

With the exposure apparatus 10 according to the second embodiment, the deformable part 120 combines the functions of the expansion and contraction mechanism and the film shaped member 68, which are provided to the exposure apparatus 10 according to the first embodiment discussed above. Furthermore, in the second embodiment, the deformable part 120 serves the functions of the cushioning parts and the support parts according to the present invention.

In the exposure apparatus 10 according to second embodiment as constituted above, the deformable part 120 itself deforms, as shown in FIG. 8, if the wafer stage 46 (wafer holder 45), or the wafer W, makes contact with the atmosphere forming part 70, and thereby moves it in the Z direction in FIG. 1. Thereby, because the force caused by the wafer stage 46 (wafer holder 45), or the wafer W, making contact with the atmosphere forming part 70 is cushioned, the exposure 10 according to the second embodiment can achieve the same effect as the exposure apparatus 10 according to the first embodiment.

Third Embodiment

Figure 9:
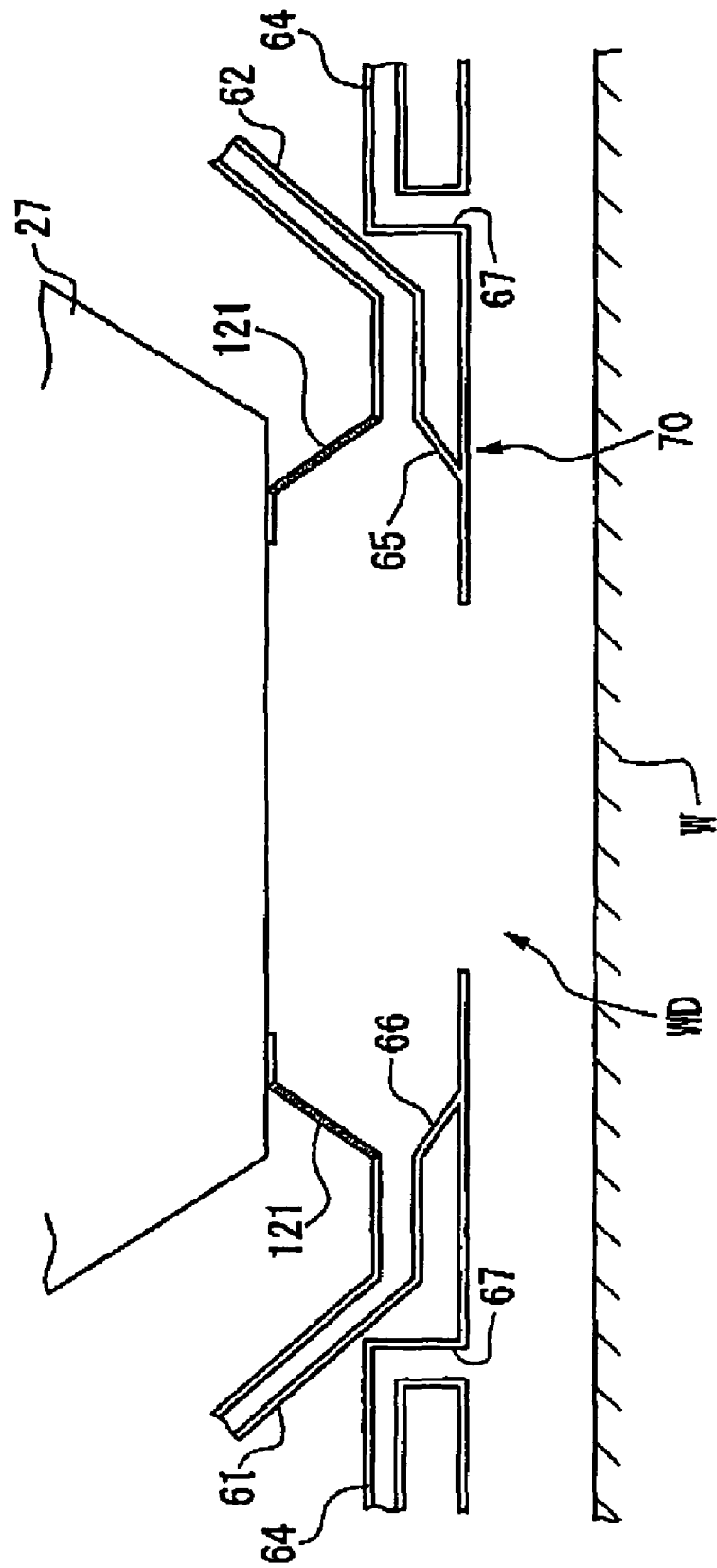
FIG. 9 shows an aspect wherein the vicinity of the working distance portion of the exposure apparatus, according to the third embodiment, is enlarged.
Figure 10:
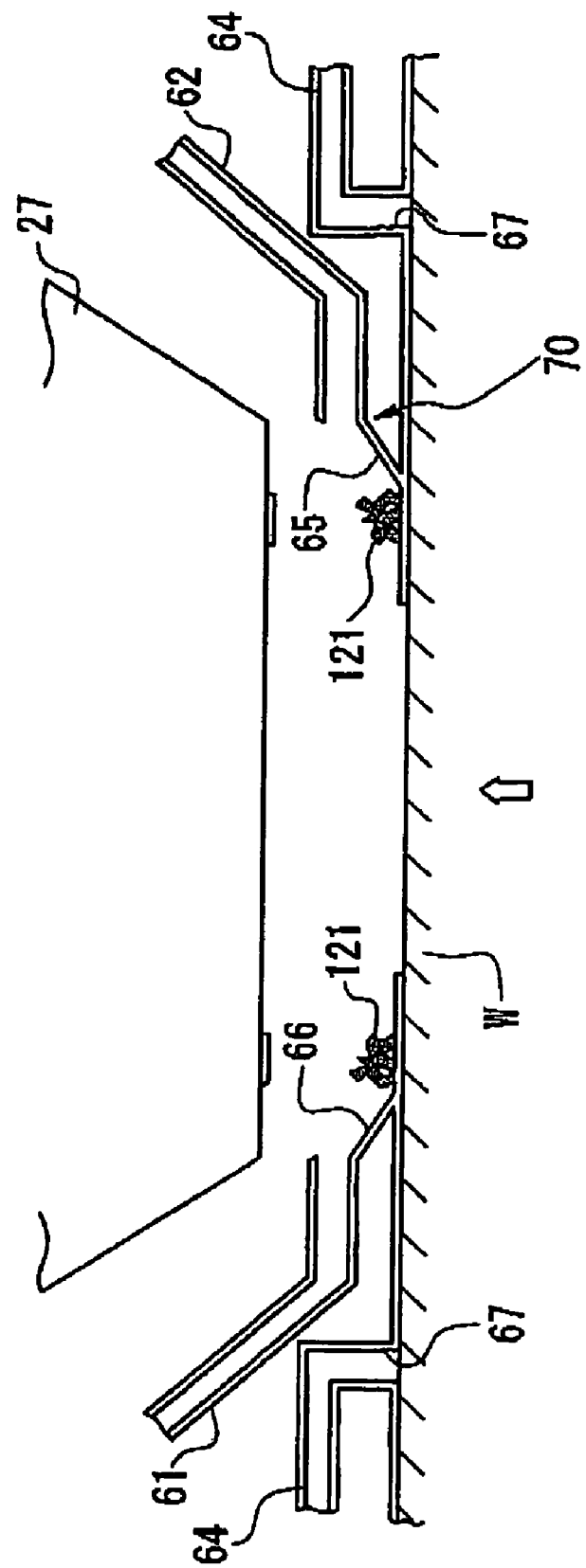
FIG. 10 shows an aspect of the exposure apparatus according to the third embodiment, wherein the wafer has contacted the atmosphere forming part.

The following explains the third embodiment of the exposure apparatus according to the present invention, referencing FIG. 9 and FIG. 10. FIG. 9 shows an aspect of the vicinity of the working distance portion WD in the exposure apparatus according to the third embodiment, viewed from the X direction in FIG. 1, which was explained the first embodiment. A deformable part 121 in FIG. 9 is made of a plastically deformable member (e.g., glass, metal, and the like), and other aspects of the constitution of the exposure apparatus 10 according to the third embodiment are the same as those in the second embodiment.

In the exposure apparatus 10 according to the third embodiment thus constituted, the deformable part 121 plastically deforms if the wafer stage 46 (wafer holder 45), or the wafer W, makes contact with the atmosphere forming part 70 and thereby moves it in the Z direction in FIG. 1. For example, if the deformable part 121 is made of glass, then it will be destroyed by the plastic deformation, as shown in FIG. 10. Thereby, because the force caused by the wafer stage 46 (wafer holder 45), or the wafer W, making contact with the atmosphere forming part 70 is cushioned, the exposure apparatus 10 according to the third embodiment can achieve the same effect as that of the exposure apparatus 10 according to the first embodiment. Furthermore, if the deformable part 121 were destroyed, as discussed above, it would be necessary to replace the atmosphere forming part 70, however, the atmosphere forming part 70 can be manufactured at a low cost compared with the projection optical system PL. Consequently, compared with the case of replacing the projection optical system PL, the exposure apparatus can be easily returned to service.

Furthermore, a thin metal plate made of Teflon® and the like may be used as the deformable part 121; in this case, the force caused by the wafer stage 46 (wafer holder 45), or the wafer W, making contact with the atmosphere forming part 70 is cushioned by, for example, the bending of the deformable part 121.

Furthermore, the deformable part 121 may be made of a brittle material that break without plastically deforming. Ceramics, such as alumina, zirconia, and aluminum nitride can be used as the brittle material.

Fourth Embodiment

Figure 11:
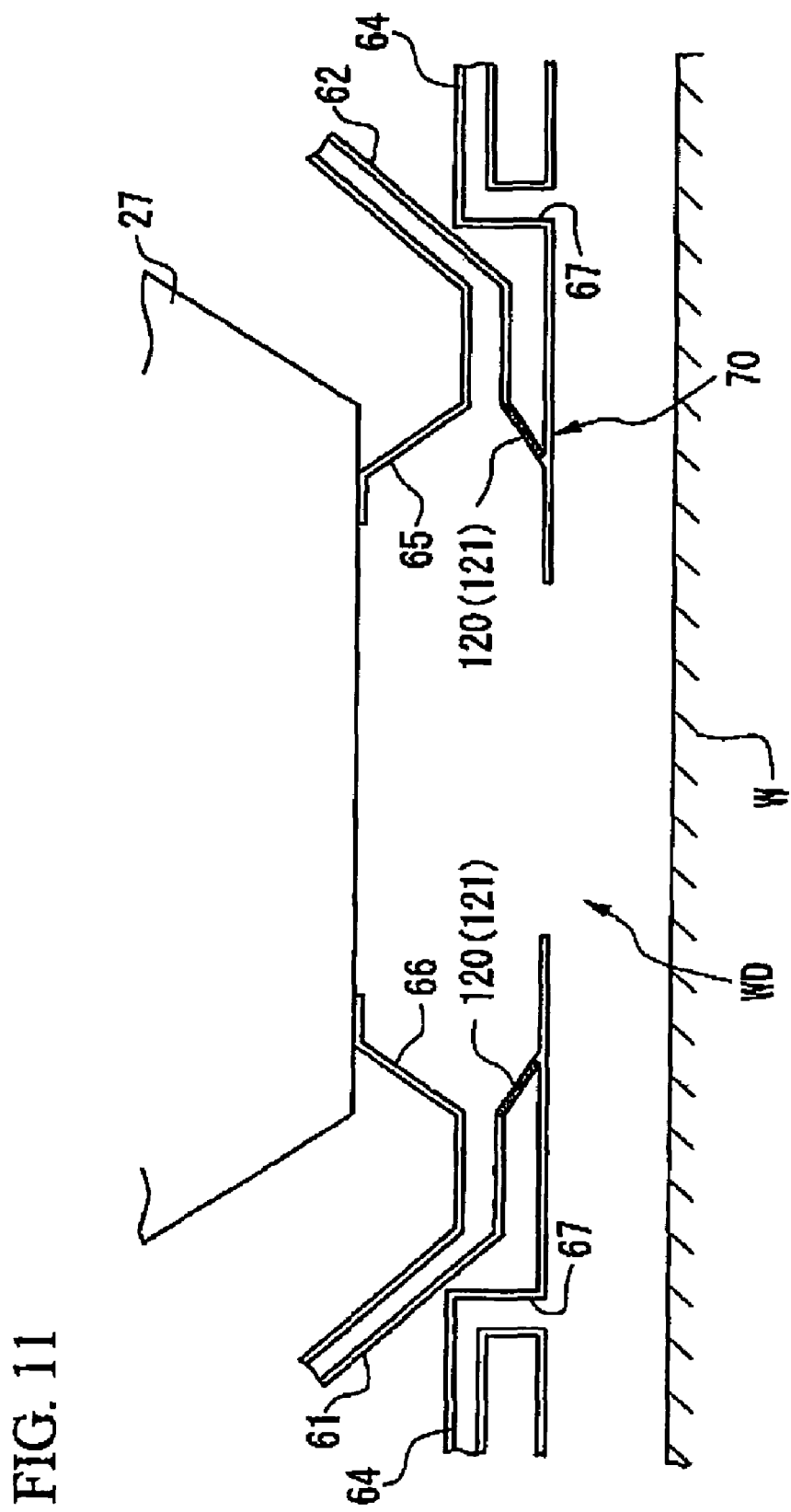
FIG. 11 shows an aspect wherein the vicinity of the working distance portion of the exposure apparatus, according to the fourth embodiment, is enlarged.

The following explains the fourth embodiment of the exposure apparatus according to the present invention, referencing FIG. 11. FIG. 11 shows an aspect of the vicinity of the working distance portion WD in the exposure apparatus according to the fourth embodiment, viewed from the X direction in FIG. 1, which has explained in the first embodiment. As shown in the figure, with the exposure apparatus 10 according to the fourth embodiment, the deformable part 120 (121), which was explained in the exposure apparatus 10 according to the second and third embodiments, is provided at part of the lower part of the atmosphere forming part 70, i.e., at least part of the lower part of the gas supply port 65 and the lower part of the first intake port 66. Furthermore, in the fourth embodiment, the upper part of the atmosphere forming part 70 is directly fixed to the barrel 27, and thereby has a structure that supports the atmosphere forming part 70; furthermore, the upper part of the atmosphere forming part 70 has the function of the support parts according to the present invention. In addition, the deformable parts 120 (121) serve the function of the cushioning parts according to the present invention. In addition, outside of the constituent elements discussed above, the constitution of the exposure apparatus according to the fourth embodiment is the same as that of the first embodiment.

In the exposure apparatus 10 according to the fourth embodiment thus constituted, the deformable part 121 elastically deforms, or plastically deforms, if the wafer stage 46 (wafer holder 45), or the wafer W, makes contact with the atmosphere forming part 70 and thereby moves it in the Z direction in FIG. 1. Thereby, because the force caused by the wafer stage 46 (wafer holder 45), or the wafer W, making contact with the atmosphere forming part 70 is cushioned, the exposure apparatus 10 according to the fourth embodiment can achieve the same effect as that of the exposure apparatus 10 according to the first embodiment.

Fifth Embodiment

Figure 12:
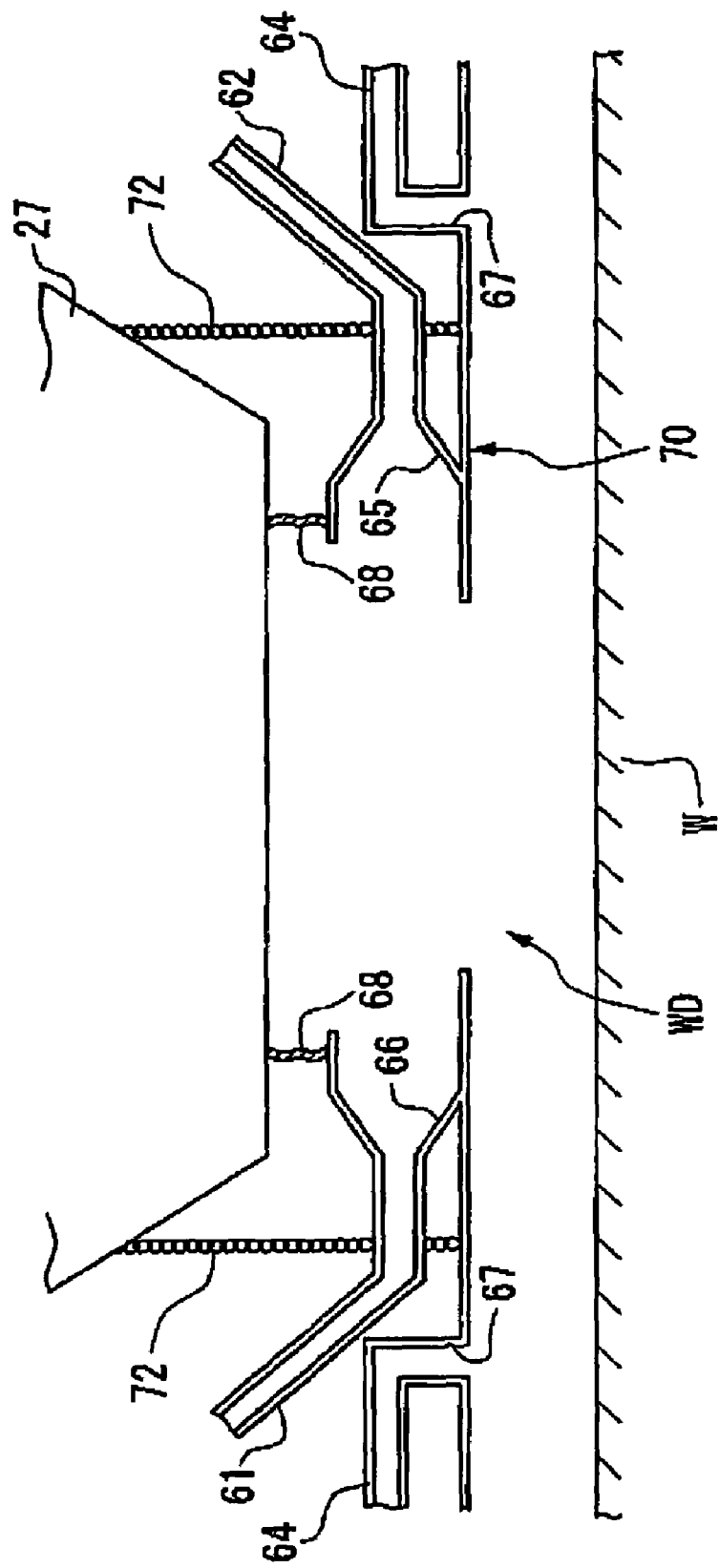
FIG. 12 shows an aspect wherein the vicinity of the working distance portion of the exposure apparatus, according to the fifth embodiment, is enlarged.
Figure 13:
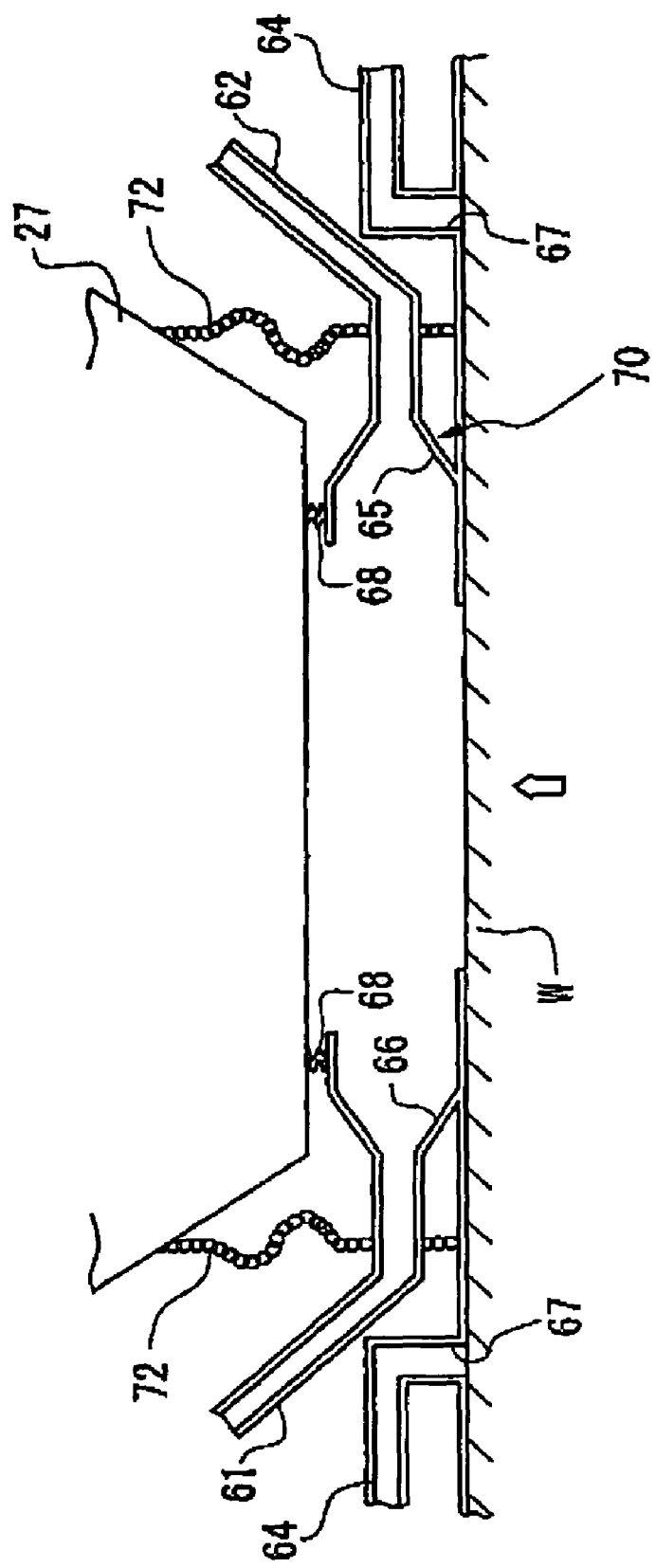
FIG. 13 shows an aspect of the exposure apparatus according to the fifth embodiment, wherein the wafer has contacted the atmosphere forming part.

The following explains the fifth embodiment of the exposure apparatus according to the present invention, referencing FIG. 12 and FIG. 13. Furthermore, the fifth embodiment explains a mode wherein the exposure apparatus according to the present invention has deformable support parts 72 separate from the atmosphere forming part 70.

FIG. 12 shows an aspect of the vicinity of the working distance portion WD of the exposure apparatus according to fifth embodiment, viewed from the X direction in FIG. 1, which was explained in the first embodiment. As shown in FIG. 12, the exposure apparatus according to the fifth embodiment has deformable support parts 72 instead of the support parts 71 explained in the first embodiment, and other aspects of the constitution are the same as that in the first embodiment. Cord shaped members, e.g., chains, can be used as the deformable support parts 72.

In the exposure apparatus 10 according to the fifth embodiment thus constituted, the support parts 72 deform, as shown in FIG. 13, if the wafer stage 46 (wafer holder 45), or the water W, makes contact with the atmosphere forming part 70 and thereby moves it in the Z direction in FIG. 1. Thereby, because the force caused by the wafer stage 46 (wafer holder 45), or the wafer W, making contact with the atmosphere forming part 70 is cushioned, the exposure apparatus 10 according to the fifth embodiment can achieve the same effect as that of the exposure apparatus 10 according to the first embodiment.

The above explained the embodiments of the exposure apparatus according to the present invention, referencing the attached drawings, but the present invention is, of course, not limited to the embodiments discussed above. It is obvious that a person of skill in the art can conceive of various modified examples or revised examples within the scope of the technical concept recited in the claims, and it is understood that these, of course, pertain to the technical scope of the present invention.

Furthermore, the abovementioned embodiments illustrated cases wherein the wafer stags 46 (wafer holder 45), or the wafer W, made contact perpendicularly with the atmosphere forming part 70. However, the force caused by the wafer stage 46 (wafer holder 45), or the wafer W, making contact with the atmosphere forming part 70 is cushioned even if such contact is diagonal.

In addition, the exposure apparatus according to the abovementioned embodiments may be provided with a sensor that detects the fact that the force caused by the wafer stage 46 (wafer holder 45), or the wafer W, making contact with the atmosphere forming part 70 is cushioned. In addition, an emergency stopping means may be provided that temporarily stops the operation of the exposure apparatus based on information obtained from this sensor.

In addition, the entire atmosphere forming part according to the abovementioned embodiments may be constituted by the deformable part 120 (121) explained in the second, third, and fourth embodiments.

In addition, the atmosphere forming mechanism according to the present invention may be adapted to an immersion exposure apparatus.

The modes discussed above explained a constitution wherein a transmissive gas was supplied, as the specified fluid to the space between the front portion of the projection optical system PL and the wafer W. However, if the present invention is adapted to an immersion exposure apparatus, a liquid for immersion exposure is supplied instead of the transmissive gas. If the liquid for immersion exposure is supplied, then a liquid supply piping is used instead of the gas supply piping 62, and a first water discharge piping and a second water discharge piping are used instead of the first exhaust piping 61 and the second exhaust piping 64.

Figure 14:
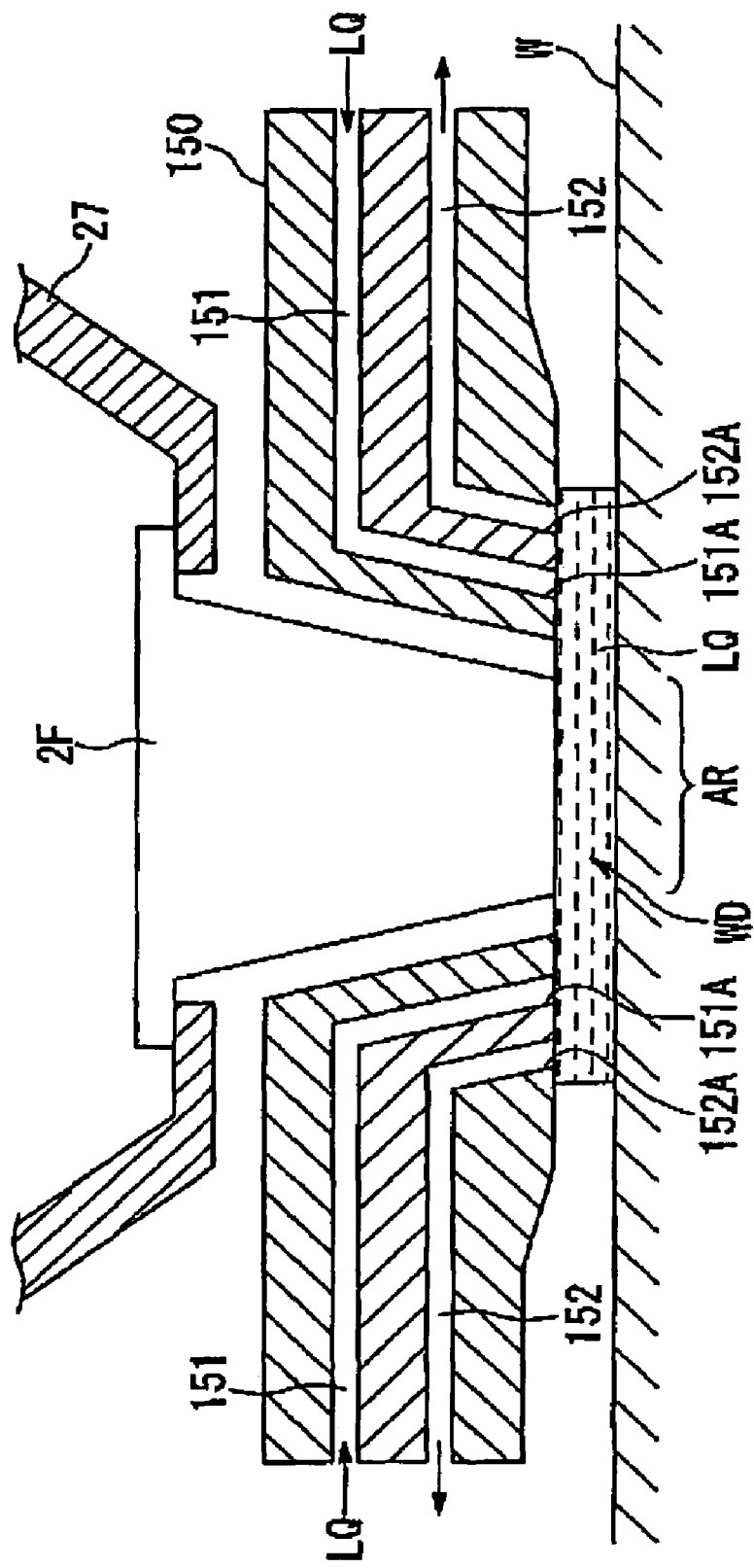
FIG. 14. shows the constitution of an atmosphere forming part of an immersion exposure apparatus.

Furthermore, another embodiment will now be explained, referencing FIG. 14, wherein the atmosphere forming mechanism according to the present invention is adapted to the immersion exposure apparatus. With the immersion exposure apparatus, an optical element 2F, which is the front portion that constitutes the projection optical system PL, is exposed more than the barrel 27, and contacts the liquid LQ in an immersion area AR. Atmosphere forming parts 150 include a liquid supply path 151, which is connected to a liquid supply mechanism (not shown) and supplies the liquid LQ to the working distance portion WD, and a liquid recovery path 152, which is connected to a liquid recovery mechanism (not shown) and recovers the liquid LQ from the working distance portion WD. The liquid supply path 151 includes a liquid supply port 151A, which is disposed so that it opposes the surface of the substrate W, and liquid recovery path 152 includes a liquid recovery port 152A, which is disposed so that it opposes the surface of the substrate W. The liquid supply ports 151A are provided at positions on both sides of the X axis so that the projection area AR of the projection optical system PL is interposed therebetween, and the liquid recovey ports 152A are provided on the outer sides of the liquid supply ports 151A with respect to the projection area AR of the projection optical system PL so that they surround the projection area AR. The atmosphere forming parts 150 so constituted can form, between the projection optical system PL and the wafer W, a liquid atmosphere larger than the projection area AR and smaller than the substrate W on the part of the substrate W that includes the projection area AR. Thus, the atmosphere forming parts 150, which form the liquid atmosphere, may be supported by the support parts 71, as explained in the first embodiment, or may be constituted by the deformable part 120, 121, as explained in the second and third embodiments. In addition, the entirety or at least part of the atmosphere forming part 150 (e.g., the wafer stage 46 side) may be made of a brittle material (e.g., glass or ceramics, such as alumina, zirconia, and aluminum nitride) that breaks more easily than the material that constitutes the barrel 27, the wafer stage 46 (wafer holder 45), and the like, so that part of the atmosphere forming part 150 chips when the wafer stage 46 (wafer holder 45) makes contact therewith.

Furthermore, if adapting the present invention to the immersion exposure apparatus, it is also possible to adopt a projection optical system that fills a liquid in the space of the optical path on both the image plane (wafer) side optical element (plane parallel plate) of the optical elements that constitute the projection optical system, and the object plane (reticle) side, as disclosed in PCT International Publication No. WO2004/019128. In addition, the wafer stage 46 includes a measurement stage of the type disclosed in Japanese Published Laid Publication No. H11-135400.

Furthermore, each of the embodiments explained an example of using the barrel 27 as the support platform that supports the atmosphere forming parts 70, 150, but the present invention is not limited to this constitution. For example, the barrel base plate 104 can be used as the support platform. In that case, the atmosphere forming part can be attached to the barrel base plate 104 in a state wherein the vibrations are isolated so that the vibrations of the atmosphere forming part 70 itself, which are generated when supplying or sucking in the transmissive gas, or the vibrations of the atmosphere forming part 150 itself generated when supplying or recovering the liquid, do not adversely affect the projection optical system PL.

If ArF excimer laser light (193 nm wavelength) is used as the exposure light in the immersion exposure apparatus, then pure water is supplied as the liquid LQ for immersion exposure. The refractive index n of pure water (water) is said to be substantially 1.44 for exposure light of a wavelength of approximately 193 nm, the wavelength is shorted by a factor of 1/n, i.e., approximately 134 nm, and a high resolution is obtained on the substrate. Pure water can be easily obtained in large quantities at semiconductor fabrication plants and the like, and has an advantage in that it does not adversely affect the photoresist on the substrate (wafer), the optical elements (lenses), and the like. In addition, because pure water does not adversely affect the environment and has an extremely low percentage content of impurities, it can also be expected to have the effect of cleaning the surface of the substrate and the surface of the optical element that is provided at the front surface of the projection optical system.

Thus, if ArF excimer laser light is used as the light source for the exposure light, then the depth of field is further increased by approximately n times, i.e., approximately 1.44 times, that of in air.

In addition, it is also possible to use a liquid that is transmissive with respect to the exposure light, has as high a refractive index as possible, and is stable with respect to the projection optical system and the photoresist coated on the substrate surface.

In addition, if $F_2$ laser light is used as the exposure light, then a fluorine based liquid, such as fluorine based oil, perfluorinated polyether (PFPE), and the like, that is capable of transmissive $F_2$ laser light may be used as the liquid LQ.

In addition, the exposure apparatus according to the present invention can be adapted not only to a scanning exposure type projection exposure apparatus, but also to a full-wafer exposure type (stepper type) projection exposure apparatus and the like. In addition, the magnification of the projection optical system may be not only reduction magnification, but also unity magnification or enlargement magnification.

In addition, the exposure apparatus according to the present invention can also be adapted to use as the energy beam: ArF excimer laser light (193 nm wavelength), $Kr_2$ laser light (146 nm wavelength), $Ar_2$ laser light (126 nm wavelength), and vacuum ultraviolet light with a wavelength of approximately 200-100 nm, such as the higher harmonics of YAG laser light and the like, and the higher harmonics of a semiconductor laser and the like.

In addition, instead of excimer laser light $F_2$ laser light, and the like, higher harmonics may be used by employing a fiber amplifier, which is doped by, for example, erbium (Er) (or both erbium and ytterbium (Yb)), to amplify a single wavelength laser, in the infrared region or the visible region, excited by a DFB (distributed feedback) semiconductor laser or a fiber laser, and then to convert the wavelength to ultraviolet light using a nonlinear optical crystal.

In addition, the application of the exposure apparatus is not limited to an exposure apparatus for semiconductor fabrication and can be widely adapted to, for example, an exposure apparatus for liquid crystals, wherein a rectangular glass plane is exposed with a liquid crystal display device pattern, as well as an exposure apparatus for fabricating the film magnetic heads.

Figure 15:
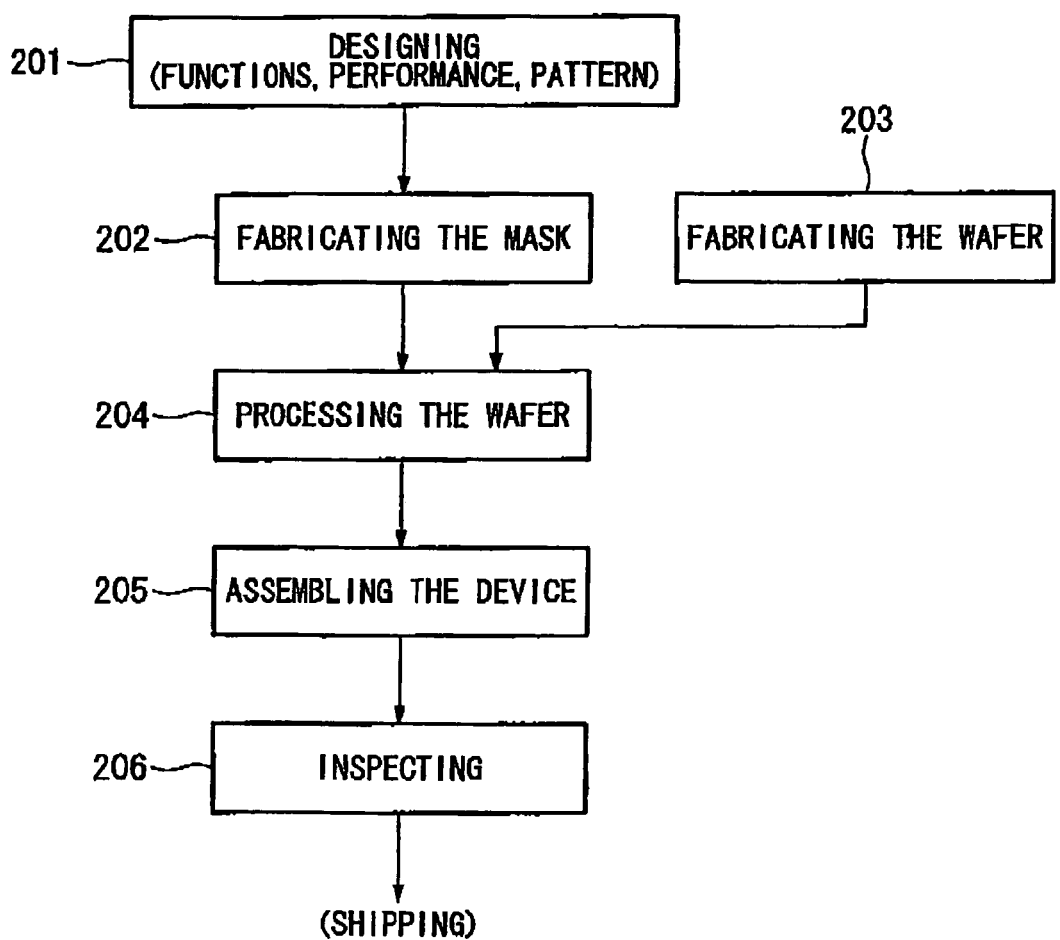
FIG. 15 is a flow chart diagram that shows one example of the process of fabricating a device.

Furthermore, as shown in FIG. 15, a device, such as a semiconductor device, is manufactured by the following steps: a step 201 that designs the functions and performance of the device, step 202 that fabricates a mask (reticle) based on the design step; a step 203 that fabricates a wafer from silicon material; a wafer processing step 204, wherein the exposure apparatus according to the present invention exposes the wafer with the pattern of the reticle; a device assembly step 205 (including the dicing process, the bonding process, and the packaging process); an inspecting step 206; and the like.

According to the present invention, even if the atmosphere forming mechanism contacts the stage or the substrate, it is possible to prevent a change in the performance of the projection optical system arising from the transmission of the force, which is caused by the stage or the substrate contacting the atmosphere forming mechanism, to the projection optical system.

What is claimed is:

1. An exposure apparatus, comprising:
   a projection optical system that projects an image of a mask onto a substrate held by a stage;
   an atmosphere forming member that includes a fluid supply port that is disposed in a space between the projection optical system and the stage or the substrate and that forms a specific fluid atmosphere between said projection optical system and said stage or said substrate; and
   a cushioning member that is provided to a support platform different from said projection optical system and that supports said atmosphere forming member and that deforms by contact with said stage or said substrate.

2. An exposure apparatus according to claim 1, wherein said cushioning member comprises an expansion and contraction part that, by expanding and contracting, brings into relative proximity a projection optical system side and a stage side of said atmosphere forming member.

3. An exposure apparatus according to claim 2, wherein said atmosphere forming member comprises an atmosphere forming part that forms said specific fluid atmosphere; and
   said cushioning member comprises a flexible material that connects said atmosphere forming part to a barrel that holds said projection optical system.

4. An exposure apparatus according to claim 2, wherein said atmosphere forming member comprises an atmosphere forming part that forms said specific fluid atmosphere, and a support part that supports said atmosphere forming part to said support platform; and
   said support part also serves as said expansion and contraction part.

5. An exposure apparatus according to claim 4, wherein said support part comprises:
   a first support part comprising one end part attached to said support platform; and
   a second support part comprising:
   one end part that engages an other end part of said first support part; and an other end part attached to said atmosphere forming part; and when said atmosphere forming part makes contact with said stage or said substrate, then the other end part of said first support part and the one end part of said second support part disengage.

6. An exposure apparatus according to claim 5, wherein
said other end part of said first support part comprises a first flange part, which is formed in a direction away from said projection optical system;
said one end part of said second support part comprises a second flange part formed toward said projection optical system; and
said first support part and said second support part engage by the mounting of said second flange part to said first flange part.

7. An exposure apparatus according to claim 2, wherein
said atmosphere forming member comprises an atmosphere forming part that forms said specific fluid atmosphere; and
one end part of said expansion and contraction part is attached to said support platform, and an other end part of said expansion and contraction part comprises a cord shaped member attached to said atmosphere forming part.

8. An exposure apparatus according to claim 1, wherein
said cushioning member comprises a deformable part that, by deforming, brings into relative proximity a projection optical system side and a stage side of said atmosphere forming member.

9. An exposure apparatus according to claim 8, wherein
an elastically deformable member is used in said deformable part.

10. An exposure apparatus according to claim 8, wherein
a plastically deformable member is used in said deformable part.

11. An exposure apparatus according to claim 1, wherein
said atmosphere forming member comprises an atmosphere forming part that forms said specific fluid atmosphere; and
said cushioning member is attached to one part of said atmosphere forming part.

12. An exposure apparatus according to claim 11, wherein
said atmosphere forming member supports said atmosphere forming part through said cushioning member.

13. An exposure apparatus according to claim 11, wherein
said cushioning member is provided to part of said atmosphere forming part on said stage or said substrate side.

14. An exposure apparatus according to claim 11, wherein
said cushioning member is made of a plastically deformable member or an elastically deformable member.

15. An exposure apparatus according to claim 1, wherein
said atmosphere forming member comprises an atmosphere forming part that forms said specific fluid atmosphere; and
said cushioning member forms at least part of said atmosphere forming part and comprises a brittle material.

16. An exposure apparatus according to claim 1, wherein
a clearance, which is at least a distance that said atmosphere forming member moves when said stage or said substrate makes contact with said atmosphere forming member, is provided between said atmosphere forming member and said projection optical system.

17. A device fabricating method, comprising:
using the exposure apparatus according to claim 1, and transferring a device pattern formed on said mask onto said substrate.

18. An exposure apparatus that exposes a substrate via a fluid, the exposure apparatus comprising:
an optical system having a plurality of optical elements;
a stage that holds the substrate;
an atmosphere forming unit that includes a fluid supply port and that forms an atmosphere of the fluid between the optical system and the stage or the substrate, at least a portion of the atmosphere forming unit being disposed in a space between the optical system and the stage or the substrate; and
a support unit that supports the atmosphere forming unit, wherein at least a portion of the atmosphere forming unit is deformed by contact of the atmosphere forming unit with said stage or said substrate.

19. An exposure apparatus according to claim 18, wherein the atmosphere forming unit comprises a deformable portion that is deformed by contact of the atmosphere forming unit with the stage or the substrate.

20. An exposure apparatus according to claim 19, wherein the deformable portion has an elastically deformable member.

21. An exposure apparatus according to claim 19, wherein the deformable portion has a plastically deformable member.

22. An exposure apparatus according to claim 19, wherein the deformable portion is formed from a brittle material.

23. An exposure apparatus according to claim 18, wherein the support unit is attached to a support platform and at least a portion of the support unit is deformed by contact of the atmosphere forming unit or the support unit with the stage or the substrate.

24. An exposure apparatus according to claim 23, wherein the support unit comprises an expansion and contraction part that is expanded or contracted by contact of the atmosphere forming unit or the support unit with the stage or the substrate.

25. An exposure apparatus according to claim 24, wherein the expansion and contraction part comprises:
a first support member attached to the support platform; and
a second support member attached to the atmosphere forming unit,
the first support member and the second support member being engaged with each other,
the engagement of the first support member and the second support member being released by contact of the atmosphere forming unit or the support unit with the stage or the substrate.

26. An exposure apparatus according to claim 25, wherein a damper is provided between the first support member and the second support member.

27. An exposure apparatus according to claim 23, wherein the support unit comprises a cord shaped member that is deformed by contact of the atmosphere forming unit or the support unit with the stage or the substrate.

28. An exposure apparatus according to claim 27, wherein the cord shaped member has a chain.

29. An exposure apparatus according to claim 23, wherein a support platform comprises a barrel or a barrel base plate, the barrel holding the optical system, the barrel base plate holding the barrel.

30. An exposure apparatus according to claim 18, wherein the fluid includes a liquid, and
the atmosphere forming unit forms a liquid immersion region between the optical system and the stage or the substrate.

* * * * *